(12) United States Patent
Fukushima et al.

(10) Patent No.: US 9,052,975 B2
(45) Date of Patent: *Jun. 9, 2015

(54) RANDOM NUMBER GENERATOR WITH RING OSCILLATION CIRCUIT

(75) Inventors: Kazuhiko Fukushima, Hyogo (JP); Atsuo Yamaguchi, Hyogo (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 346 days.

This patent is subject to a terminal disclaimer.

(21) Appl. No.: 13/565,591

(22) Filed: Aug. 2, 2012

(65) Prior Publication Data

US 2012/0303690 A1 Nov. 29, 2012

Related U.S. Application Data

(63) Continuation of application No. 12/193,105, filed on Aug. 18, 2008, now Pat. No. 8,260,835, which is a continuation of application No. 10/874,360, filed on Jun. 24, 2004, now Pat. No. 7,424,500.

(30) Foreign Application Priority Data

Jun. 24, 2003 (JP) ................................. 2003-179798

(51) Int. Cl.
*G06F 7/58* (2006.01)
*G11C 29/36* (2006.01)
(52) U.S. Cl.
CPC ................ *G06F 7/588* (2013.01); *G11C 29/36* (2013.01); *G11C 2029/3602* (2013.01)
(58) Field of Classification Search
None
See application file for complete search history.

(56) References Cited

U.S. PATENT DOCUMENTS

| 4,769,777 A | 9/1988 | Bittle |
| 4,905,176 A | 2/1990 | Schulz |

(Continued)

FOREIGN PATENT DOCUMENTS

| JP | 06-314188 | 11/1994 |
| JP | 09-046136 | 2/1997 |

(Continued)

OTHER PUBLICATIONS

Benjamin Jun et al., "The Intel Random Number Generator," Analysis of the Intel Random Number Generator, Cryptography Research, Inc. White Paper, pp. 1 and 3-4, Apr. 22, 1999.

(Continued)

*Primary Examiner* — David H Malzahn
(74) *Attorney, Agent, or Firm* — McDermott Will & Emery LLP

(57) ABSTRACT

A random number generator includes a ring oscillator having an EX-OR gate and four inverters together forming a loop. This loop enters stable state for a start signal having the low level and oscillates for the start signal having the high level. When the start signal has a pulse of a width shorter than the loop's delay time, output nodes responsively, sequentially enter metastable state hovering between the high and low levels. The metastable waveform becomes smaller with time and finally disappears. As metastable state cannot be controlled in longevity, it disappears at any random number node. A counter thus outputs a signal serving as true random number data depending on the longevity of the metastable state. A random number generator miniaturized and having reduced power consumption, and of high performance can thus be implemented.

3 Claims, 24 Drawing Sheets

(56) References Cited

U.S. PATENT DOCUMENTS

| | | | |
|---|---|---|---|
| 5,903,522 | A | 5/1999 | Carley |
| 6,194,971 | B1 | 2/2001 | Glen et al. |
| 6,480,072 | B1 | 11/2002 | Walsh et al. |
| 6,631,390 | B1 | 10/2003 | Epstein |
| 6,907,526 | B2 | 6/2005 | Tanimoto et al. |
| 7,424,500 | B2 * | 9/2008 | Fukushima et al. .......... 708/251 |
| 7,652,863 | B2 | 1/2010 | Ito et al. |
| 8,008,967 | B2 | 8/2011 | Okano et al. |
| 8,260,835 | B2 * | 9/2012 | Fukushima et al. .......... 708/251 |
| 2002/0156819 | A1 | 10/2002 | Oerlemans |
| 2003/0014452 | A1 | 1/2003 | Le Quere |
| 2004/0264233 | A1 * | 12/2004 | Fukushima et al. .......... 365/145 |
| 2005/0004960 | A1 | 1/2005 | Hars |
| 2008/0313249 | A1 * | 12/2008 | Fukushima et al. .......... 708/251 |
| 2009/0243734 | A1 | 10/2009 | Margittai |
| 2012/0303690 | A1 * | 11/2012 | Fukushima et al. .......... 708/251 |

FOREIGN PATENT DOCUMENTS

| | | |
|---|---|---|
| JP | 10-051276 | 2/1998 |
| JP | 2000-298577 | 10/2000 |
| JP | 2001-136053 | 5/2001 |
| JP | 2001-331306 | 11/2001 |
| JP | 2001-344904 | 12/2001 |
| JP | 2002-236582 A | 8/2002 |
| JP | 2002-366347 A | 12/2002 |
| JP | 2003-131867 | 5/2003 |
| TW | 531659 | 5/2003 |
| WO | WO-01/67231 | 9/2001 |

OTHER PUBLICATIONS

David Carlson et al., "High performance SSL, IPSEC protocol aware security processor," 2002 ISSCC 2003 Submission No. 262, pp. 6.

Taiwanese Office Action issued in Taiwanese Patent Application No. TW 93115596, Mailed Jun. 13, 2007.

Chinese Office Action, with English Translation, issued in Chinese Patent Application No. CN 200410061692.7, mailed Jun. 15, 2007.

Schulz, "Integrated Circuit Compatible Random Number Generator," IBM Technical Disclosure Bulletin, Apr. 1988, pp. 333-335, Manassas, USA.

Japanese Office Action, with English Translation, issued in Japanese Patent Application No. JP 2003-179798, dated Jan. 6, 2009.

Chinese Office Action, w/ English Translation, issued in Chinese Patent Application No. CN 2008100956490, dated Aug. 21, 2009.

* cited by examiner

RANDOM NUMBER GENERATOR WITH RING OSCILLATION CIRCUIT

RELATED APPLICATIONS

This application is a Continuation of U.S. application Ser. No. 12/193,105, filed on Aug. 18, 2008 now U.S. Pat. No. 8,260,835, which is a Continuation of U.S. application Ser. No. 10/874,360, filed on Jun. 24, 2004, now U.S. Pat. No. 7,424,500, claiming priority of Japanese Patent Application No. 2003-179798, filed on Jun. 24, 2003, the disclosures of which Applications are incorporated by reference herein.

BACKGROUND OF THE INVENTION

1. Field of the Invention

The present invention relates generally to random number generators and particularly to random number generators with a ring oscillation circuit.

2. Description of the Background Art

In the field of information security it is essential to use random numbers and in recent years there is an increasing demand for high-performance random number generators generating true random numbers, natural random numbers that have uniformity (i.e., are identical in probability in value and frequency of appearance) and appear without ordinality, relevance with preceding and following numbers, or periodicity. One such random number generator employs a random pulse obtained by utilizing weak radioactive rays, resistors, diodes and other similar elements' thermal noise, crystal oscillators' fluctuations, and other similar natural phenomena.

In a conventional random number generator a flip-flop generating a random number has an input line with a jitter generation circuit added thereto so as to utilize an input signal's jitter to allow the flip-flop to provide an output having an increased range of indeterministic operation, as proposed for example in Japanese Patent Laying-Open No. 2002-366347.

Furthermore, a substrate effect of a field effect transistor configuring a ring oscillation circuit is utilized to vary the ring oscillation circuit's oscillation frequency to generate a clock signal varying in frequency, and the clock signal's pulses are counted by a counter to generate a random number, as described for example in Japanese Patent Laying-Open No. 2001-331306.

Random number generators utilizing random pulses attributed to natural phenomena, however, include a random pulse generation source, a signal amplifier, a waveform shaping circuit, a uniformity optimization circuit and other similar analog elements and as a result would have increased circuit scales and also be complicated. This is an obstacle to mounting these elements as an integrated large scale integrated circuit (LSI) on microcomputers, application specific integrated circuits (ASICs) and the like. In addition, those utilizing thermal noise are susceptible to external noise and the like and thus operate less reliably. Those utilizing radioactive rays may have negative effect on environments.

For application to ultra-compact and thin, high-technology equipment, random number generators further miniaturized and having reduced power consumption, and of high performance are required.

SUMMARY OF THE INVENTION

A main object of the present invention is to provide a random number generator miniaturized and having reduced power consumption, and of high performance.

The present invention provides a random number generator including: a plurality of delay circuits connected in a loop; a pulse generation circuit generating in the loop a pulse signal having a pulse of a width shorter than a total delay time of the plurality of delay circuits; and a counter connected to an output node of a delay circuit of the plurality of delay circuits to count how many times the pulse signal passes through the output node, and output a true random number data signal based on a value counted by the counter. In the loop, a metastable state occurs having a longevity of "0", "1" or binarized to generate true random number data. A random number generator miniaturized and having reduced power consumption, and of high performance can thus be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
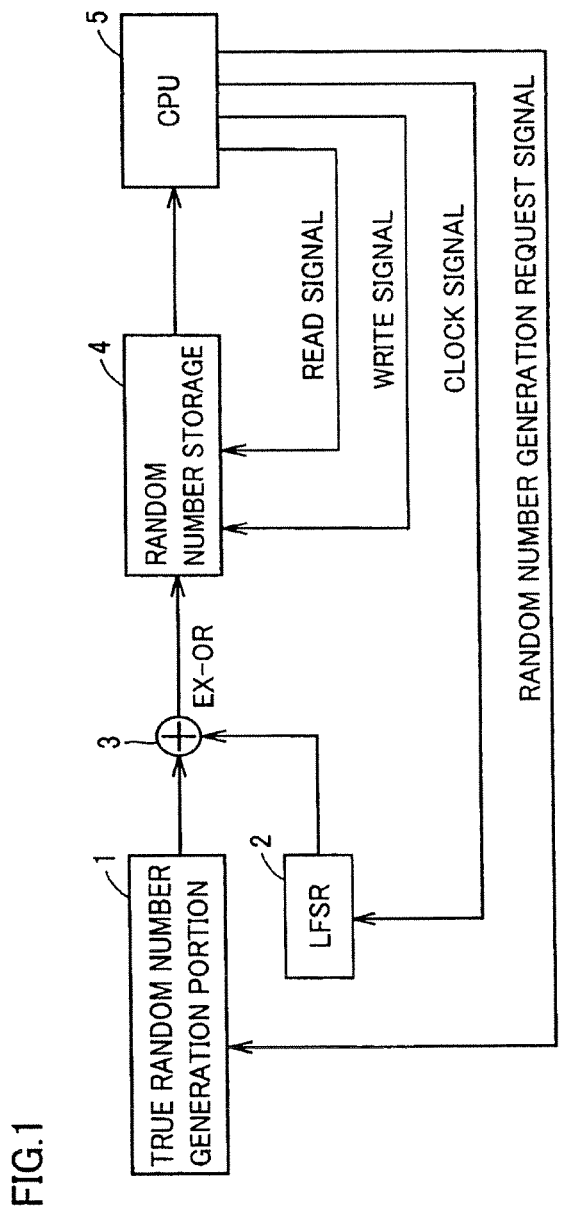
FIG. 1 is a block diagram showing a schematic configuration of a random number generator of the present invention in a first embodiment.

With reference to FIG. 1, a first embodiment provides a random number generator including a true number generation portion 1, an LFSR 2, an exclusive OR (EX-OR) gate 3, a random number storage 4, and a central processing unit (CPU) 5.

True random number generation portion 1 operates in response to a random number generation request signal to generate true random number data (random number data that does not have ordinalily and has high quality). LFSR 2 operates in accordance with a clock signal output from CPU 5 to generate uniform pseudo random number data, random number data that has "0" and "1" both generated with a probability of 50%, and has ordinality. True random number generation portion 1 and LSFR 2 are asynchronous. LFSR 2 receiving the clock signal from CPU 5 may instead receive a write signal from CPU 5.

EX-OR gate 3 receives the true random number data from true random number generation portion 1 and the pseudo random number data from LFSR 2 and provides their exclusive-OR data to random number storage 4. While true random number generation portion 1 outputs true random number data unguaranteed in uniformity, LFSR 2 outputs pseudo random number data guaranteed in uniformity. Accordingly, EX-OR gate 3 outputs uniform random number data.

Random number storage 4 operates in response to a write signal output from CPU 5 to store the random number data received from EX-OR gate 3 and in response to a read signal output from CPU 5 to output a random number value. CPU 5 generates the random number generation request signal, the clock signal, and the write and read signals to control true random number generation portion 1, LFSR 2 and random number storage 4 and reads a random number value from random number storage 4.

Figure 2:
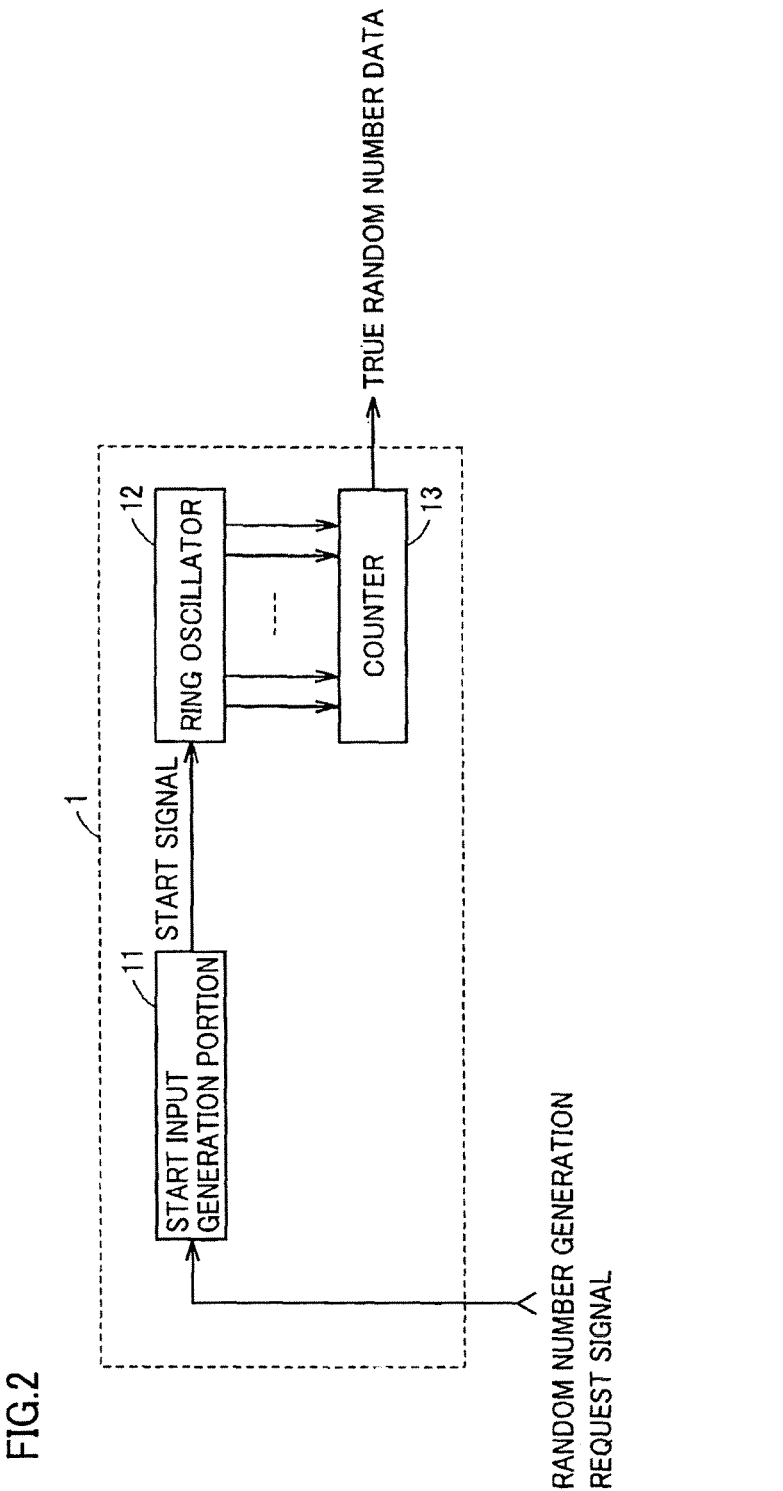
FIG. 2 is a block diagram showing a configuration of the true random number generation portion shown in FIG. 1.

With reference to FIG. 2, true random number generation portion 1 includes a start input generation portion 11, a ring oscillator 12 and a counter 13.

Start input generation portion 11 operates in response to a random number generation request signal output from CPU 5 to generate a start signal for generating true random number data. Ring oscillator 12 oscillates or enters stable state in response to the start signal output from start input generation portion 11. Counter 13 counts the number of pulses of a signal transmitted to nodes on a loop of ring oscillator 12 to output true random number data.

Figure 3:
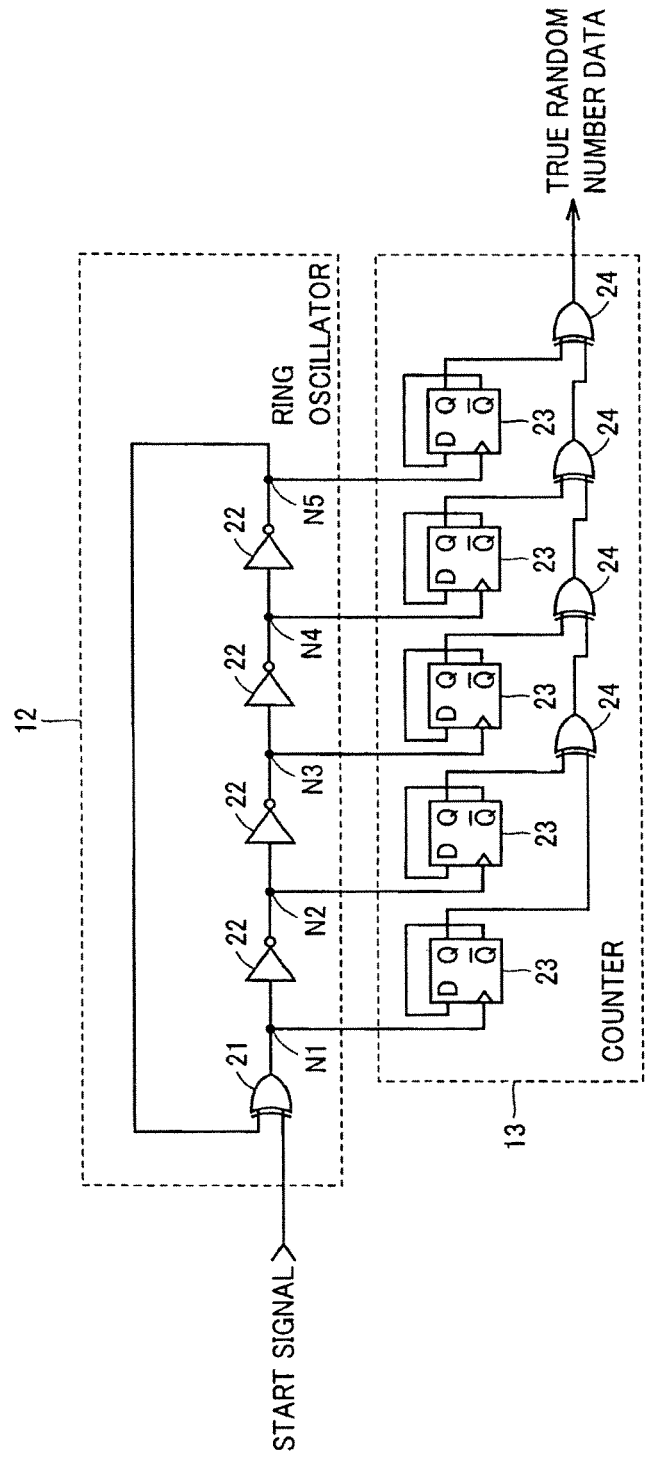
FIG. 3 is a circuit diagram showing a configuration of the ring oscillator and the counter shown in FIG. 2.

With reference to FIG. 3, ring oscillator 12 includes an EX-OR gate 21 and four inverters 22 and counter 13 includes five flip-flops 23 and four EX-OR gates 24.

In ring oscillator 12 EX-OR gate 21 has an output terminal and one input terminal with four inverters 22 connected therebetween in series. EX-OR gate 21 has the other input terminal receiving the start signal from start input generation portion 11. EX-OR gate 21 and four inverters 22 form a loop. When the start signal has the low level the loop enters stable state and when the start signal has the high level the loop oscillates. Output nodes N1-N5 are connected to flip-flops 23 at clock input terminals, respectively.

Flip-flop 23 is a 1-bit counter having a negative logic output terminal and a data input terminal connected together. Flip-flop 23 inverts an output signal in response to a rising edge of a signal input to the clock input terminal. EX-OR gate 24 has one input terminal receiving a positive logic signal output from a corresponding flip-flop 23 and the other input terminal receiving a signal output from EX-OR gate 24 of the preceding stage to output their exclusive-OR signal, except that EX-OR gate 24 of the initial stage has one input terminal receiving a positive logic signal output from flip-flop 23 corresponding to output node N1 and the other input terminal receiving a positive logic signal output from flip-flop 23 corresponding to output node N2.

Figure 4A:
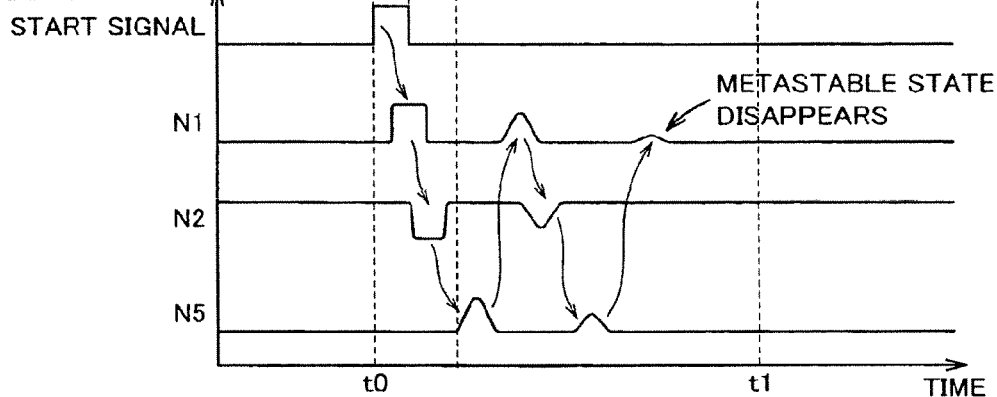
FIGS. 4A-4C are timing plots, respectively, for illustrating the FIG. 3 ring oscillator and counter in operation.
Figure 4B:
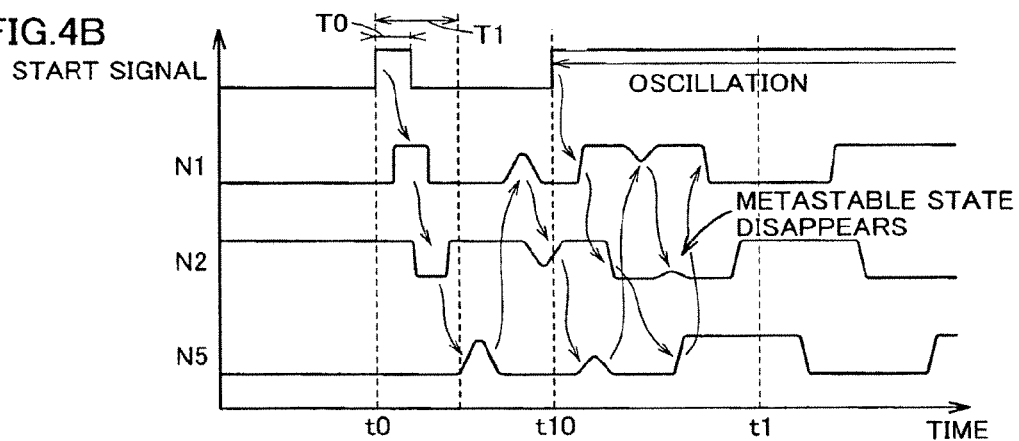
Figure 4C:
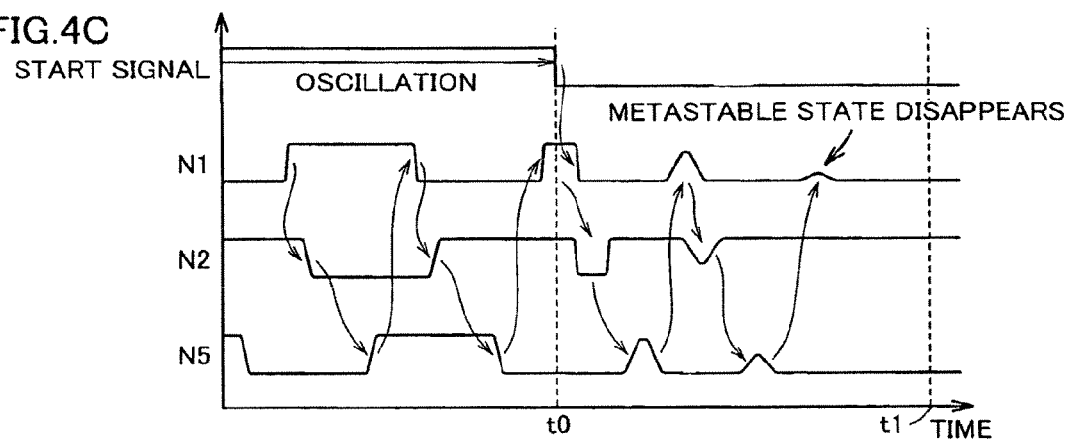

FIGS. 4A-4C are timing plots, respectively, for illustrating the FIG. 3 ring oscillator 12 and counter 13 in operation. The figures represent the start signal in three patterns for generating metastable state, an indeterministic state hovering between the high and low levels, at output nodes N1-N5.

In FIG. 4A the start signal is a pulse signal pulled high at a time t0 and pulled low when a period of time T0 elapses. The period of time T0 (the pulse's width) is set to be shorter than a delay time T1 of the loop of ring oscillator 12. In an initial state when output nodes N1, N3, N5 have a stable state in potential of the low level and output nodes N2, N4 have a stable state in potential of the high level, output node N1 has a potential having a waveform corresponding to a pulsed waveform corresponding to a delay of the start signal attributed to a delay time introduced by EX-OR gate 21. In response to the output node N1 variation in potential, output node N2 has a potential having a waveform corresponding to a pulsed waveform of output node N1 that is delayed by a delay time attributed to inverter 22 and is also inverted. Output nodes N1-N5 sequentially repeat such an operation and the pulsed wave is gradually reduced in sharpness, which is referred to as metastability. This metastable waveform becomes smaller with time and after it travels around the loop twice it disappears at output node N1. (When a metastable waveform no longer exceeds a threshold value of flip-flop 23 a decision is made that metastable state has disappeared.) Each flip-flop 23 counts two pulses. More specifically, if in an initial state each flip-flop 23 positive logic output signal is "0", the signal at the first count is "1" and at the second count is "0". Accordingly after metastable state disappears the final stage's EX-OR gate 24 outputs a signal of "0".

Note that metastable state cannot be controlled in longevity. In other words, metastable state disappears at any random node. For example, if metastable state travels around the loop twice and thereafter disappears at output node N2, flip-flop 23 corresponding to output node N1 counts three pulses and flip-flops 23 corresponding to output nodes N2-N5 each count two pulses. More specifically, if in the initial state each flip-flop 23 outputs a positive logic signal of "0" then after metastable state disappears flip-flop 23 corresponding to output node N1 outputs a positive logic signal of "1" and flip-flops 23 corresponding to output nodes N2-N5 each output a positive logic signals of "0". Thus after metastable state disappears the final stage's EX-OR gate 24 outputs a signal of "1". Thus after time t1 when a prescribed period of time elapses (or metastable state disappears), or at time t1, counter 13 outputs a signal serving as true random number data depending on the longevity of the metastable state.

Note that for some delay characteristics for example of EX-OR gate 21 and inverter 22, metastable state disappears at a particular node exclusively. To address this, an odd number (five) of flip-flops 23 are arranged so that if metastable states traveling around the loop different times, respectively, disappear at the same node, counter 13 outputs different signals. More specifically, if a metastable state travels around the loop once before it disappears at output node N2 the final stage's EX-OR gate 24 outputs a signal (of "0"), whereas if a metastable state travels around the loop twice before it disappears at output node N2 then the final stage's EX-OR gate 24 outputs a different signal (of "1"). Counter 13 thus outputs a random number of high quality.

In FIG. 4B the start signal is pulled high at time t0 and thereafter when the period of time T0 elapses the signal is pulled low, and at time t10 the signal is pulled high. From times t0 through t10 an operation similar to that described with reference to FIG. 4A is performed and output nodes N1-N5 sequentially enter metastable state. In response to the start signal pulled high at time t10 the loop oscillates. However, similarly as has been described with reference to FIG. 4A, the metastable waveform becomes smaller with time and after it travels around the loop twice it disappears at output node N2. As metastable state cannot be controlled in longevity, it disappears at any random node. Thus, after time t0 when a prescribed period of time elapses (or metastable state disappears), or at time t1, counter 13 outputs a signal serving as true random number data depending on the longevity of the metastable state.

In FIG. 4C, the start signal is pulled low at time t0. In response, the loop transitions from oscillation state to stable state an output nodes N1-N5 sequentially enter metastable state. The metastable waveform becomes smaller with time and after it travels around the loop twice it disappears at output node N1. As metastable state cannot be controlled in longevity, it disappears at any random node. Thus, after time t0 when a prescribed period of time elapses (or metastable state disappears), or at time t1, counter 13 outputs a signal serving as true random number data depending on the longevity of the metastable state.

While in the above description four inverters 22 and five flip-flops 23 are used, any even number of inverters 22 and any number of flip-flops 23 may be used.

Figure 5:
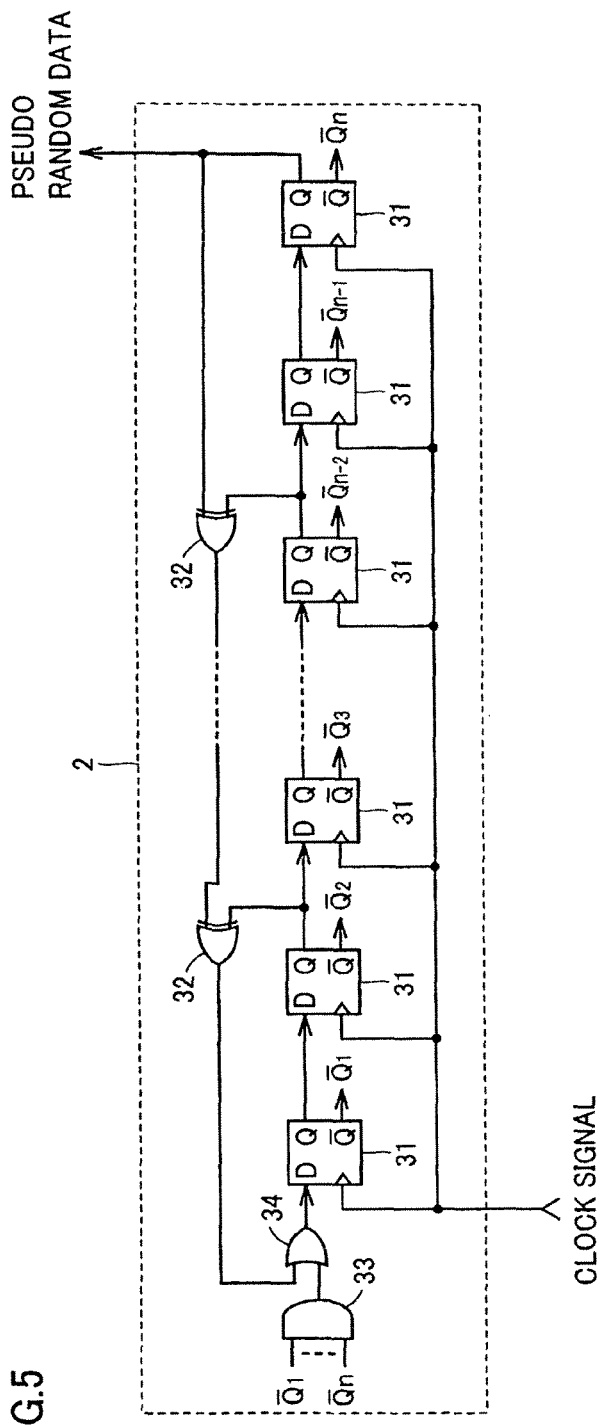
FIG. 5 is a circuit diagram showing a configuration of the linear feedback shift register (LFSR) shown in FIG. 1.

With reference to FIG. 5, LFSR 2 includes n flip-flops 31, a plurality of EX-OR gates 32, an AND gate 33 and an OR gate 34, wherein n represents any natural number.

Each flip-flop 31 has a data input terminal connected to the preceding stage's flip-flop 31 at a positive logic output terminal, a clock input terminal receiving the clock signal from CPU 5, and a negative logic output terminal connected to AND gate 33 at an input terminal, except that the initial stage's flip-flop 31 has a data input terminal connected to OR gate 34 at an output terminal.

Each EX-OR gate 32 has one input node receiving a positive logic signal output from a corresponding flip-flop-flop 31 and the other input terminal receiving a signal output from EX-OR gate 32 of the preceding stage to output their exclusive OR signal, except that the initial stage's EX-OR gate 32 has one input terminal receiving a positive logic signal output from flip-flop 31 of an (n−2)th stage and the other input terminal receiving a signal output from EX-OR gate 32 of an nth stage.

It is well known that a plurality of stages of flip-flops 31 are connected in series and a final output is fed back to generate a pseudo random number. LFSR 2 outputs pseudo random number data repeated with a periodicity depending on the number and positions of EX-OR gates 32. The number and positions of the gates are determined so that pseudo random number data is repeated with maximized periodicity. In this case, pseudo random data repeated with a periodicity of $(2^n-1)$ is generated.

AND gate 33 outputs a logical product of negative logic signals output from n flip-flops 31. OR gate 34 outputs a signal corresponding to signals output from the final stage's EX-OR gate 32 and AND gate 33, respectively. This prevents all flip-flops 31 from outputting a positive logic signal of "0" allowing LFSR 2 to output pseudo random data having a stable state of "0".

Figure 6:
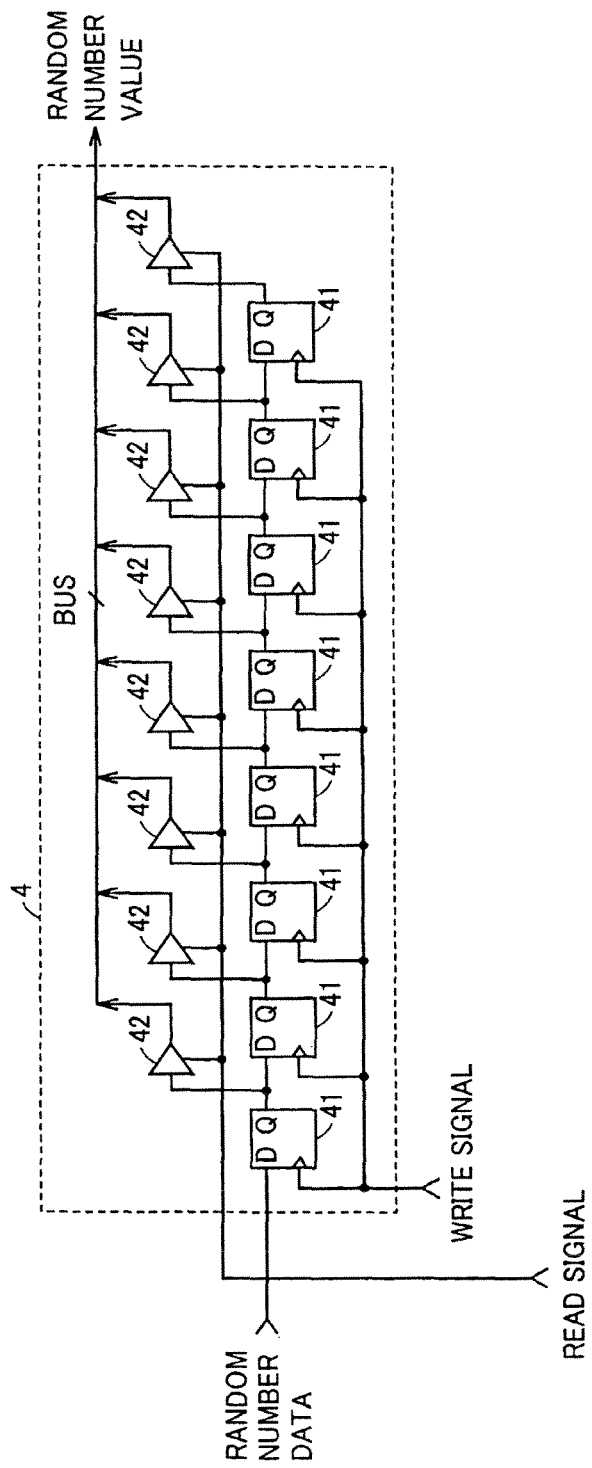
FIG. 6 is a circuit diagram showing a configuration of the random number storage shown in FIG. 1.

With reference to FIG. 6, random number storage 4 includes eight flip-flops 41 and eight buffer circuits 42 to allow 8-bit random number data to be stored therein.

Each flip-flop 41 has a data input terminal connected to the preceding stage's flip-flop 41 at a positive logic output terminal, a clock input terminal receiving a write signal from CPU 5, and a positive logic output terminal connected to a corresponding buffer circuit 42, except that the initial stage's flip-flop 41 has a data input terminal receiving random number data from EX-OR gate 3. Eight buffer circuits 42 operate in response to a read signal output from CPU 5 to output random number data stored in the eight respective flip-flops 41 to CPU 5 through a bus in the form of an 8-bit random number value.

Figure 7:
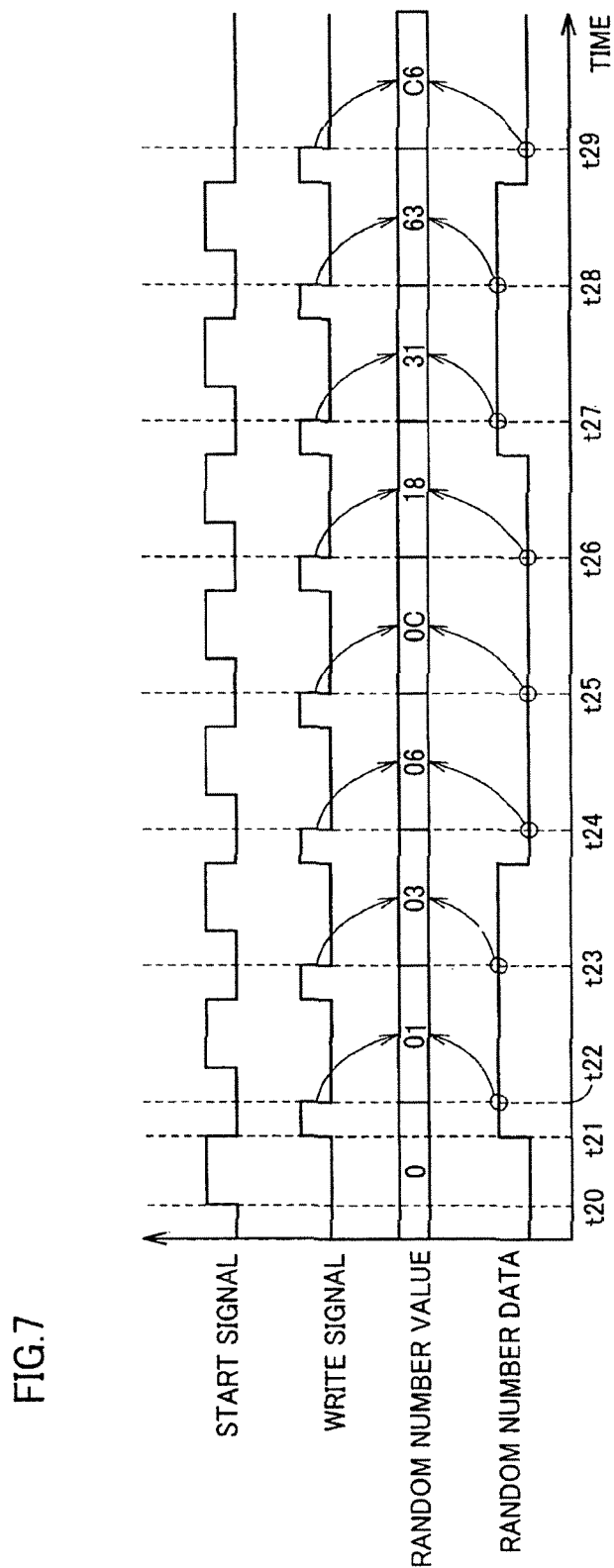
FIG. 7 is timings plots for illustrating the FIG. 6 random number storage in operation.

FIG. 7 is timing plots for illustrating the FIG. 6 random number storage 4 in operation. In FIG. 7, a random number value is represented hexadecimally and set to "0" in an initial state. When the start signal has the high level the true number generation portion 1 ring oscillator 12 oscillates and when the start signal has the low level the ring oscillator enters stable state. To facilitate the description of the operation, random number data is simplified and represented as a signal set to "1" or "0" in response to the start signal's falling edge. The start signal's pulse width is (t21-t22) and the write signal's pulse width is (t22-t21), and the start and write signals both have a periodicity of (t23-t22). At time t21 the start signal is pulled low and random number data is set to "1" and the write signal is also pulled high. At time t22 in response to the write signal pulled low the initial stage's flip-flop 41 stores the instant random number data of "1", when the current hexadecimal random number value will be "01" (00000001 in binary representation).

At time t23 in response to the write signal pulled low the initial stage's flip-flop 41 stores the instant random data of "1" and the second stage's flip-flop 41 stores at time t22 the random data of "1" stored by the initial stage's flip-flop-flop 41. The current random number will be "03" (00000011 in binary representation). Thus at time t24 a random number value of "06" (00000110 in binary representation) and at time t25 a random number value of "0C" (00001100 in binary representation) will be provided. This operation is sequentially repeated and at time t29 a random number value of "C6" (11000110 in binary representation) is provided and 8-bit random number data is stored. Subsequently in response to a read signal from CPU 5 the random number value of "C6" is output.

Thus random number storage 4 configured of an 8-stage shift register allows 8-bit random number data to be stored. CPU 5 no longer needs to frequently access random number storage 4.

Thus in the first embodiment the true number generation portion 1 ring oscillator 12 can be controlled in operation and metastable state can be binarized in longevity to have "0" or "1" to generate true random number data. A random number generator miniaturized and having reduced power consumption, and of high performance can thus be implemented.

While in the above description 8-bit random number data is stored, m-bit random number data can be stored if random number storage 4 is formed of m flip-flops 41 and m buffer circuits 42, wherein m represents any natural number.

First Embodiment in Exemplary Variation

Figure 8:
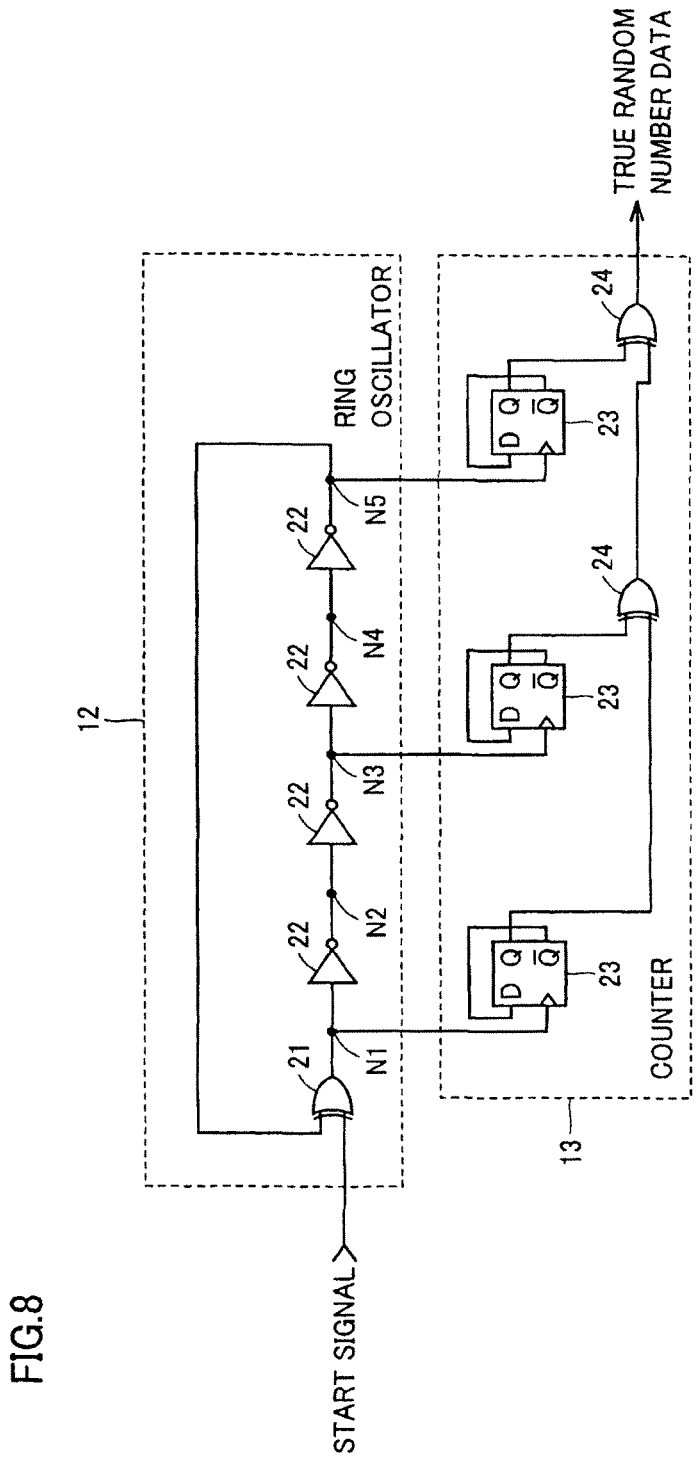
FIG. 8 is a circuit diagram showing a configuration of the ring oscillator and counter of the first embodiment in an exemplary variation.

With reference to FIG. 8, the first embodiment in an exemplary variation provides ring oscillator 12 and counter 13, which are different from ring oscillator 12 and counter 13 of the first embodiment shown in FIG. 3 in that counter 13 includes flip-flop 23 reduced in number to three. In FIG. 8, flip-flop 23 is connected only to odd numbered output nodes N1, N3, N5.

In ring oscillator 12 a delay characteristic of EX-OR gate 21 causes output node N1 to tend to bias in potential toward either the high or low level. For example if a delay time introduced when EX-OR gate 21 pulls low a signal to be output therefrom is longer than that introduced when EX-OR gate 21 pulls the signal high, the EX-OR gate 21 output node N1 tends to have potential biasing toward the high level. Furthermore, because of a delay characteristic of each inverter 22, metastable state tends to disappear more often at either the odd-numbered output nodes N1, N3, N5 or even-numbered output nodes N2, N4. In that case if, as shown in FIG. 3, output nodes N1-N5 all have flip-flop 23 connected thereto, counter 13 would output true random number data biased to either "0" or "1" and thus failing to maintain uniformity.

By contrast, when the odd-numbered output nodes N1, N3, N5 alone have flip-flop 23 connected thereto, as shown in FIG. 8, metastable state disappearing more often at either the odd-numbered output nodes N1, N3, N5 or the even-numbered output nodes N2, N4 does not result in counter 13 outputting true random number data biased to "0" or "1". For example, true random number data output from counter 13 when metastable state disappears at output nodes N1, N5 is different from that output from the counter when metastable state disappears at output node N3. True random number data is thus improved in uniformity.

Thus in the first embodiment in the exemplary variation flip-flops 23 are associated with odd-numbered output nodes N1, N3, N5 of ring oscillator 12 to allow through random number generation portion 1 to generate true random number data increased in quality. A random number generator of higher performance can thus be implemented.

While in the above description the odd-numbered output nodes N1, N3, N5 have flip-flops 23 connected thereto, it is also similarly effective to have the even-numbered output nodes N2, N4 having flip-flops 23 connected thereto.

Second Embodiment

Figure 9:
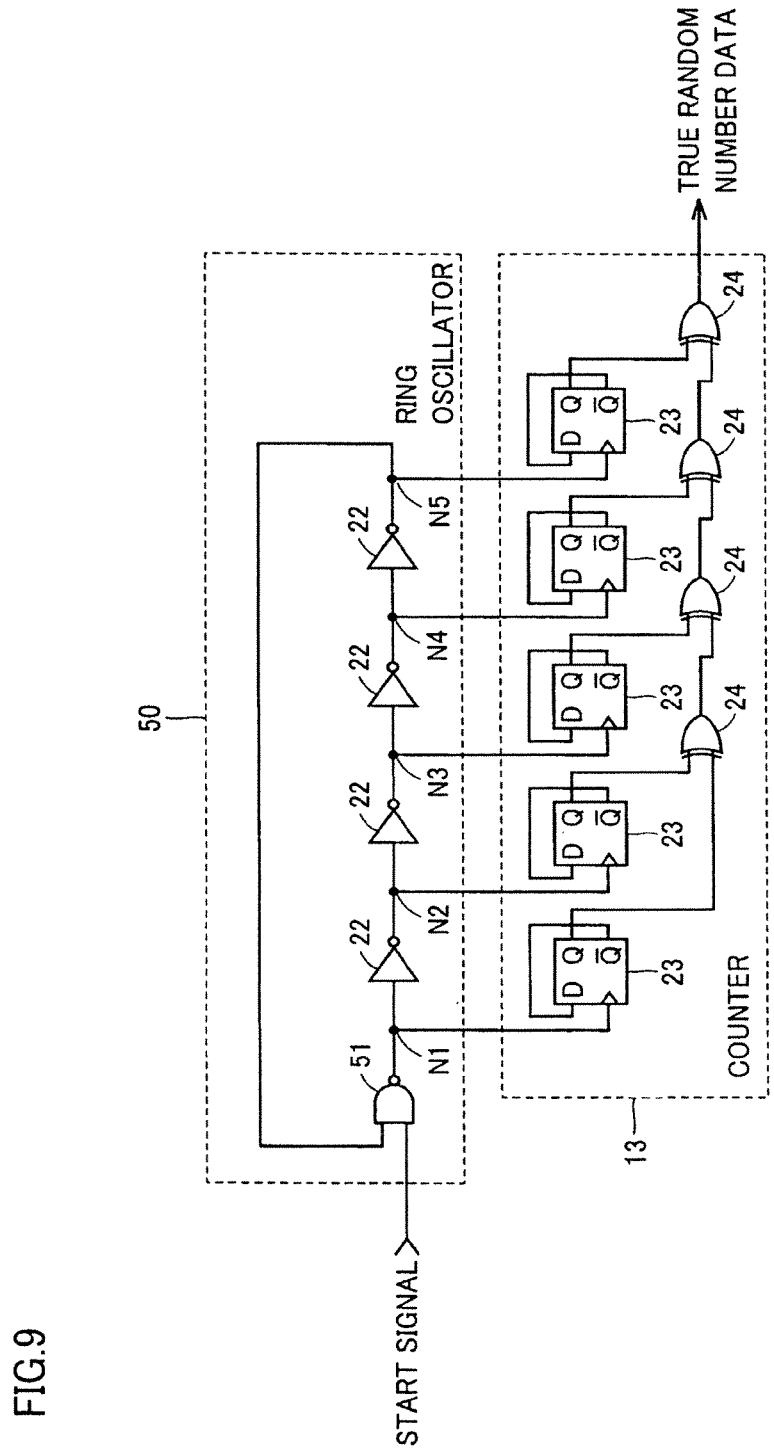
FIG. 9 is a circuit diagram showing a configuration of the ring oscillator and counter in accordance with the present invention in a second embodiment.

With reference to FIG. 9, a second embodiment provides a ring oscillator 50 and counter 13, which are different from ring oscillator 12 and counter 13 of the first embodiment shown in FIG. 3 in that EX-OR gate 21 is replaced with an NAND gate 51.

Figure 10A:
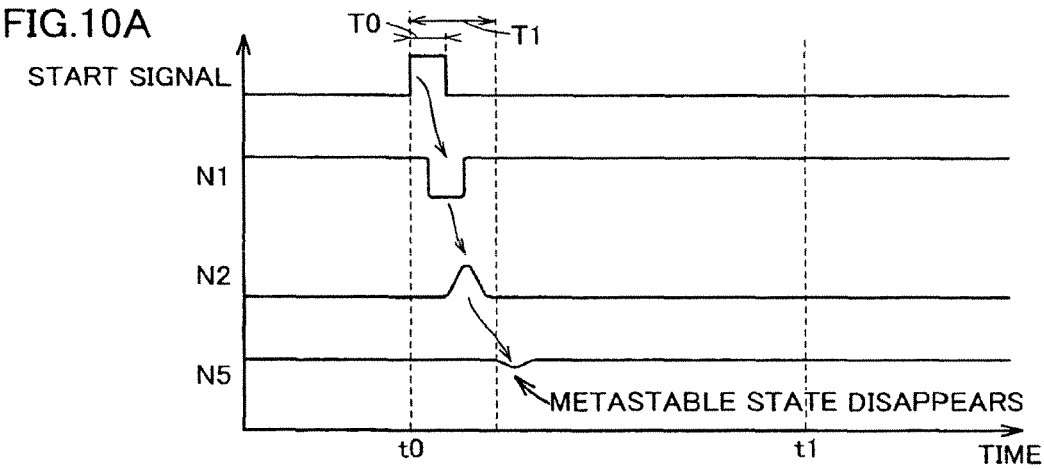
FIGS. 10A-10C are timing plots, respectively, for illustrating the FIG. 9 ring oscillator and counter in operation.
Figure 10B:
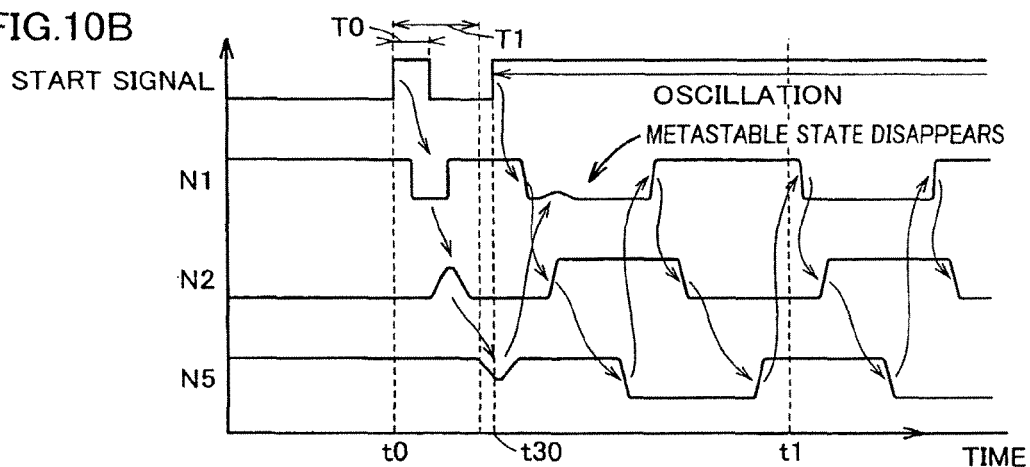
Figure 10C:
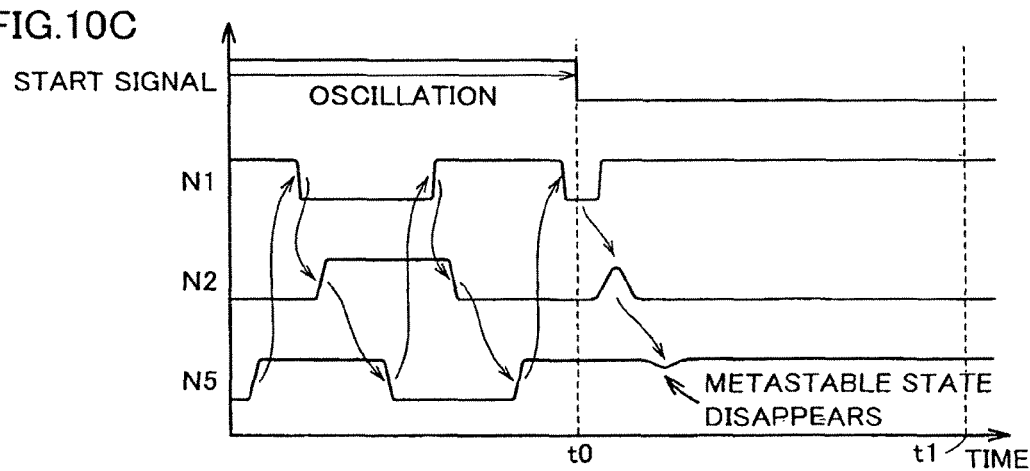

FIGS. 10A-10C are timing plots, respectively, for illustrating ring oscillator 50 and counter 13 in operation. The figures represent the start signal in three patterns for generating metastable state at output nodes N1-N5.

In FIG. 10A the start signal is a pulse signal pulled high at a time t0 and pulled low when a period of time T0 elapses. The period of time T0 (the pulse's width) is set to be shorter than a delay time T1 of the loop of ring oscillator 50. In an initial state when output nodes N1, N3, N5 have a stable state in potential of the high level and output nodes N2, N4 have a stable state in potential of the low level, output node N1 has a potential having a pulsed waveform corresponding to a delay of the start signal attributed to a delay time introduced by NAND gate 51, and also inverted. In response to output node N1 varying in potential, output nodes N2-N5 sequentially enter metastable state. The metastable waveform becomes smaller with time and it disappears at output node N5. As metastable state cannot be controlled in longevity, it disappears at any random node. Thus after a metastable state occurs when a prescribed period of time elapses, or at time t1, counter 13 outputs a signal serving as true random number data depending on the longevity of the metastable state.

Note that in this case NAND gate 51 is employed to configure a circuit. Accordingly when the start signal has the low level, output node N1 has a potential fixed at the high level. In other words, metastable state travels around the loop only once. Accordingly, the circuit is so configured that metastable state disappears while it travels around the loop once.

In FIG. 10B the start signal is pulled high at time t0 and thereafter when the period of time T0 elapses the signal is pulled low, and at time t30 the signal is pulled high. From times t0 through t30 an operation similar to that described with reference to FIG. 10A is performed and output nodes N1-N5 sequentially enter metastable state. In response to the start signal pulled high at time t30 the loop oscillates. Metastable state travels around the loop once and disappears at output node N1. As metastable state cannot be controlled in longevity, it disappears at any random node. Thus, after time t0 when a prescribed period of time elapses (or metastable state disappears), or at time t1, counter 13 outputs a signal serving as true random number data depending on the longevity of the metastable state. As the start signal is fixed at the high level at time t30, it is not necessary to configure a circuit so that metastable state disappears while it travels around the loop once.

In FIG. 10C, the start signal is pulled low at time t0. In response, the loop transitions from oscillation state to stable state an output nodes N1-N5 sequentially enter metastable state. The metastable waveform becomes smaller with time and disappears at output node N5. As metastable state cannot be controlled in longevity, it disappears at any random node. Thus, after time t0 when a prescribed period of time elapses (or metastable state disappears), or at time t1, counter 13 outputs a signal serving as true random number data depending on the longevity of the metastable state.

Note that in this case the start signal is fixed at the low level and accordingly a circuit is so configured that metastable state disappears while it travels around the loop once.

Thus in the second embodiment as well as the first embodiment the true number generation portion 1 ring oscillator 50 can be controlled in operation and metastable state can be binarized in longevity to have "0" or "1" to generate true random number data. A random number generator miniaturized and having reduced power consumption, and of high performance can thus be implemented.

While in the above description four inverters 22 and five flip-flops 23 are used, any even number of inverters 22 and any number of flip-flops 23 can similarly effectively be used.

Third Embodiment

Figure 11:
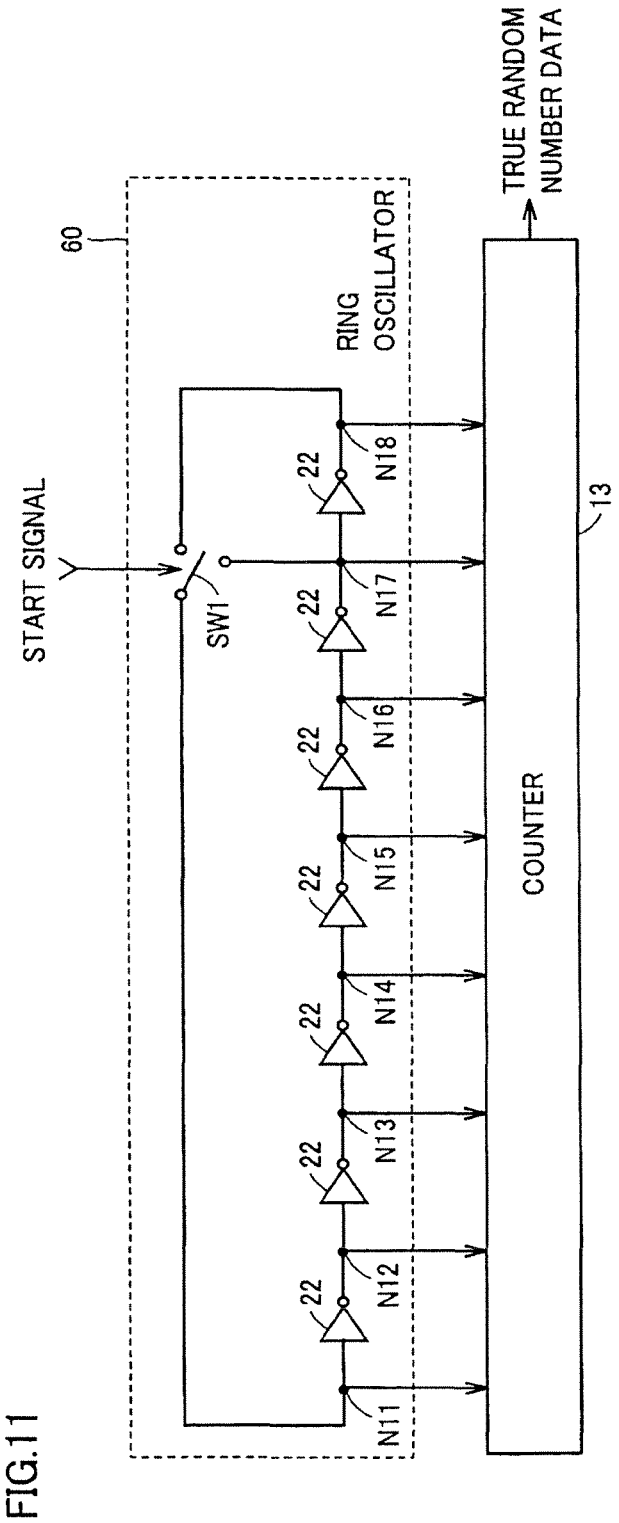
FIG. 11 is a circuit diagram showing a configuration of the ring oscillator of the present invention in a third embodiment.

With reference to FIG. 11, a third embodiment provides a ring oscillator 60 including a switch circuit SW1 and seven inverters 22.

Ring oscillator 60 has seven inverters 22 connected in series between output nodes N11 and N18. Switch circuit SW1 operates in response to the start signal of the high level to connect output nodes N11 and N18 and in response to the start signal of the low level to connect output nodes N11 and N17. More specifically, for the start signal of the high level the circuit switches to allow the loop to have seven (an odd number of) inverters 22 therein and for the start signal of the low level the circuit switches to allow the loop to have six (an even number of) inverters 22 therein. Thus for the start signal of the low level the loop enters stable state and for the start signal of the high level of the loop oscillates. Output nodes N11-N18 are connected to the counter 13 flip-flops, respectively, at their respective clock input terminals.

Ring oscillator 60 operates similarly as has been represented in the FIGS. 4A-4C timing plots. In response to the FIGS. 4A-4C three patterns of the start signal output nodes N11-N18 sequentially enter metastable state. As metastable state cannot be controlled in longevity, it disappears at any random node. After metastable state occurs when a prescribed period of time elapses (the metastable state disappears) counter 13 outputs a signal serving as true random number data depending on the longevity of the metastable state.

Thus in the third embodiment ring oscillator 60 can have seven (an odd number of) inverters 22 and six (an even number of) inverters 22 forming loops, respectively, switched by switch circuit SW1 to allow metastable state to have a longevity of "0", "1" or binarized to generate true random number data. A random number generator miniaturized and having reduced power consumption, and of high performance can thus be implemented.

Note that while in the above description switch circuit SW1 switches between a loop formed of seven inverters 22 and that formed of six inverters 22, switch circuit SW1 switching between a loop formed of any odd number of inverters and a loop formed of any even number of inverters 22 is similarly effective.

Third Embodiment in Exemplary Variation

Figure 12:
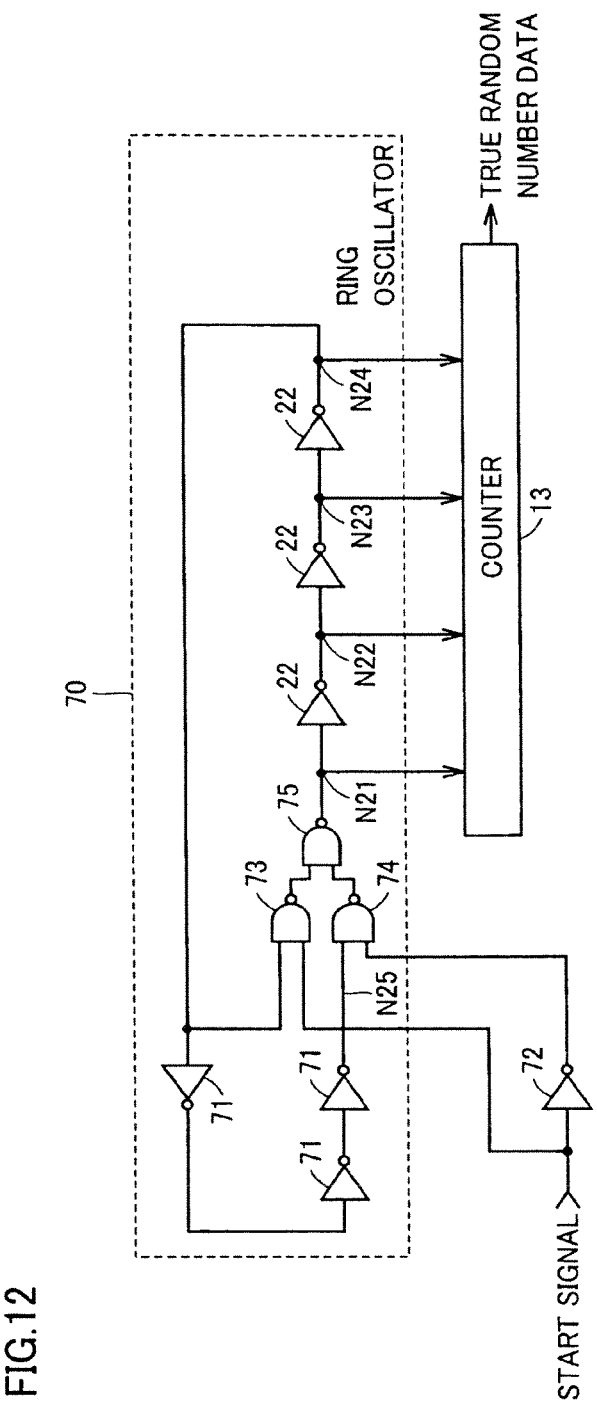
FIG. 12 is a circuit diagram showing a configuration of the ring oscillator of the third embodiment in an exemplary variation.

With reference to FIG. 12, the third embodiment in an exemplary variation provides a ring oscillator 70 including three inverters 22 and three inverters 71, an inverter 72, and NAND gates 73-75. The FIG. 12 ring oscillator 70 corresponds to the FIG. 11 ring oscillator 60 with switch circuit SW1 implemented by NAND gates 73-75 and inverter 72. More specifically, NAND gates 73-75 and inverter 72 switches between a loop formed of an odd number of inverters and a loop formed of an even-number of inverters.

In ring oscillator 70 three inverters 22 are connected between output nodes N21 and N24 in series and three inverters 71 are connected between output nodes 24 and 25 in series. NAND gate 73 has one input terminal connected to output node N24 and the other input terminal receiving a start signal. NAND gate 74 has one input terminal connected to output node N25 and the other input terminal receiving the start signal via inverter 72. NAND gate 75 has one input terminal receiving a signal from NAND gate 73 and the other terminal receiving a signal from NAND gate 74, and an output terminal connected to node N21. Output nodes N21-N24 are connected to the counter 13 flip-flops, respectively, at their respective clock input terminals.

Thus for the start signal of the high level NAND gate 74 outputs a signal fixed at the high level and the loop can be regarded as that formed of three inverters 22 and NAND gates 73, 75, i.e., a loop formed of an odd number of inverters. For the start signal of the low level NAND gate 73 outputs a signal fixed at the high level and the loop can be regarded as that formed of three inverters 22, three inverters 71 and NAND gates 74 and 75, i.e., a loop formed of an even number of inverters. Thus for the start signal of the high level the loop oscillates and that of the low level the loop enters stable state.

Ring oscillator 70 operates similarly as the FIG. 11 ring oscillator 60 does. Note that while the FIGS. 3 and 9 ring oscillators 12, 50 do not ensure metastability for some timing of the start signal, the FIG. 12 ring oscillator 70 ensures metastability.

Figure 13:
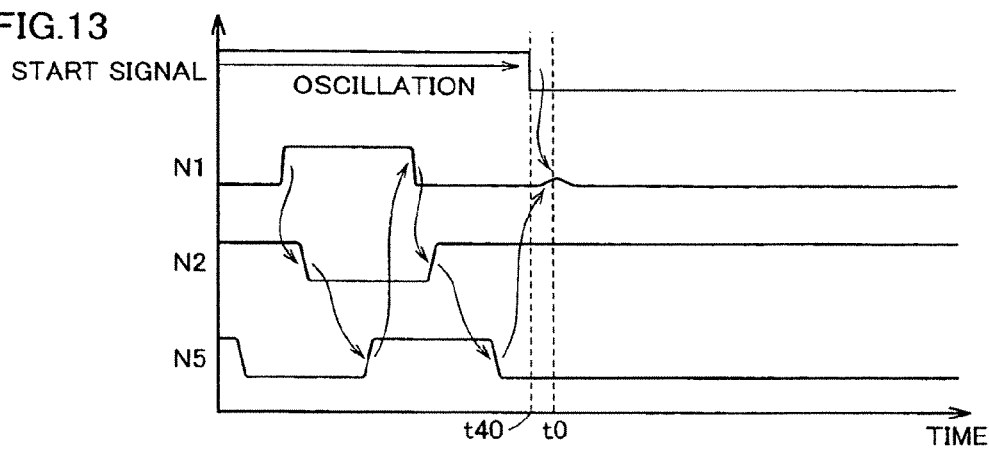
FIG. 13 is timing plots for illustrating an operation performed when the FIG. 3 ring oscillator does not enter metastable state.

FIG. 13 is timing plots for illustrating the FIG. 3 ring oscillator 12 in operation when metastable state does not occur, as compared with FIG. 4C. In FIG. 13 at a time t40, which is earlier than time to, the start signal is pulled low.

In response, the loop transitions from oscillation state to stable state, when output node N1 has a potential pulled in response to a variation in potential of output node N5 to the high level and at that instant the output node N1 potential is pulled low in response to the start signal being pulled low. Output nodes N1-N5 thus do not have metastable state.

Figure 14A:
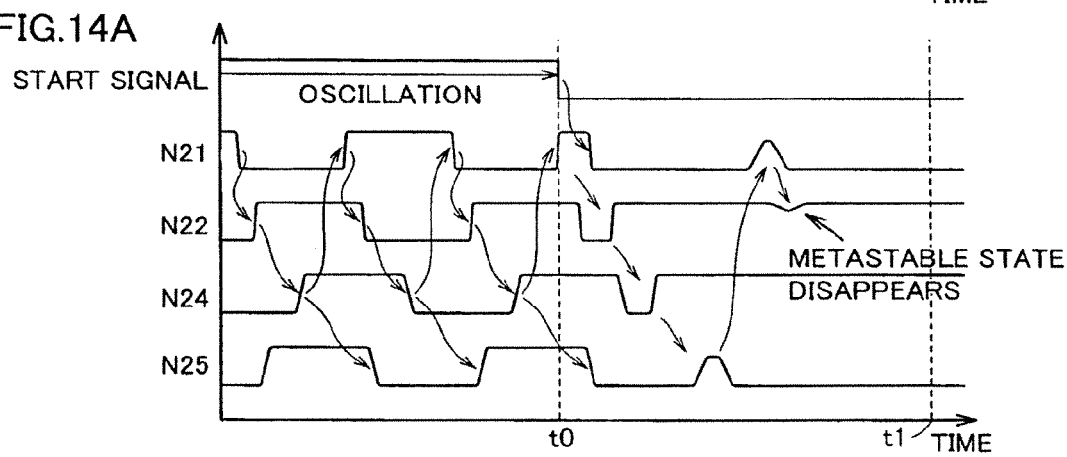
FIGS. 14A and 14B are timing plots, respectively, for illustrating an operation ensuring that the FIG. 12 ring oscillator enters metastable state.
Figure 14B:
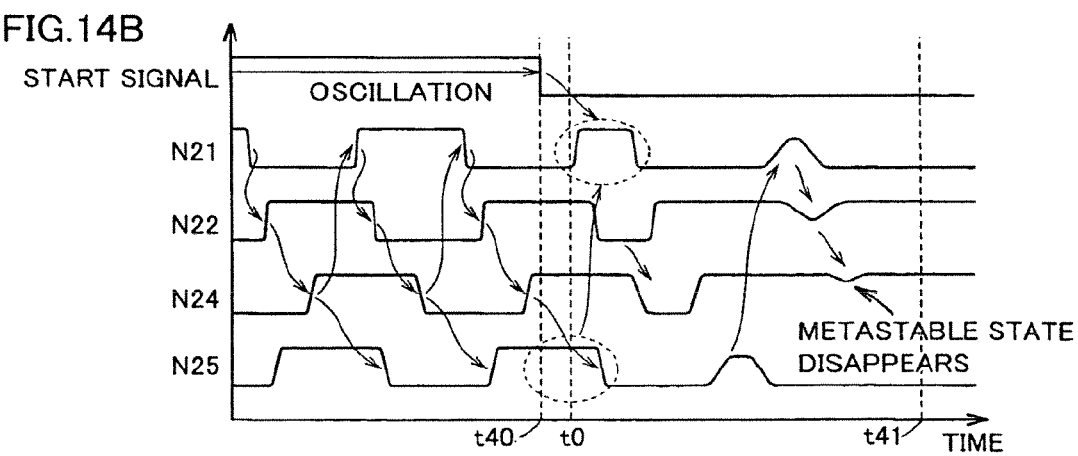

FIGS. 14A and 14B are each timing plots for illustrating the FIG. 12 ring oscillator 70 in operation ensuring metastability. FIG. 14A is timing plots provided when the start signal is pulled low at time t0 and FIG. 14B is timing plots provided when the start signal is pulled low at time t40 earlier than time t0.

In FIG. 14A, at time t0 the start signal is pulled low and in response the loop transitions from oscillation state to stable state, and similarly as has been illustrated in the FIG. 4C timing plots, output nodes N21-N25 sequentially enter metastable state. The metastable waveform becomes smaller with time and after it travels around the loop once it disappears at output node N22. As metastable state cannot be controlled in longevity, it disappears at any random node. Thus, after time t0 when a prescribed period of time elapses (or metastable state disappears), or at time t1, counter 13 outputs a signal serving as true random number data depending on the longevity of the metastable state.

In FIG. 14B before time t40 the loop oscillates such that the output node N21 potential varies as the output node N24 potential does. At time t40 the start signal is pulled low and the loop responsively transitions from oscillation state to stable state. Output node N21 has a potential varying in response to variation in potential of output node N25, pulled high and thereafter pulled low. Thus output nodes N21-N25 sequentially enter metastable state. Metastable state is ensured because a difference in delay time between a loop formed of an odd number of inverters and that formed of an even number of inverters is utilized. The metastable waveform becomes smaller with time and after it travels around the loop once it disappears at output node N24. As metastable state cannot be controlled in longevity, it disappears at any random node. Thus, after time t40 when a prescribed period of time elapses (or metastable state disappears), or at time t41, counter 13 outputs a signal serving as true random number data depending on the longevity of the metastable state.

Thus in the third embodiment in an exemplary variation ring oscillator 70 can have an odd number of inverters and an even number of inverters forming loops switched by a switch circuit and the loops' difference in delay time can be utilized to ensure metastability. A random number generator of higher performance can thus be implemented.

While in the above description three inverters 22 and three inverters 71 are used, any configuration allowing a loop formed of any odd number of inverters and a loop formed of any even number of inverters to be switched is similarly effective.

Fourth Embodiment

Figure 15:
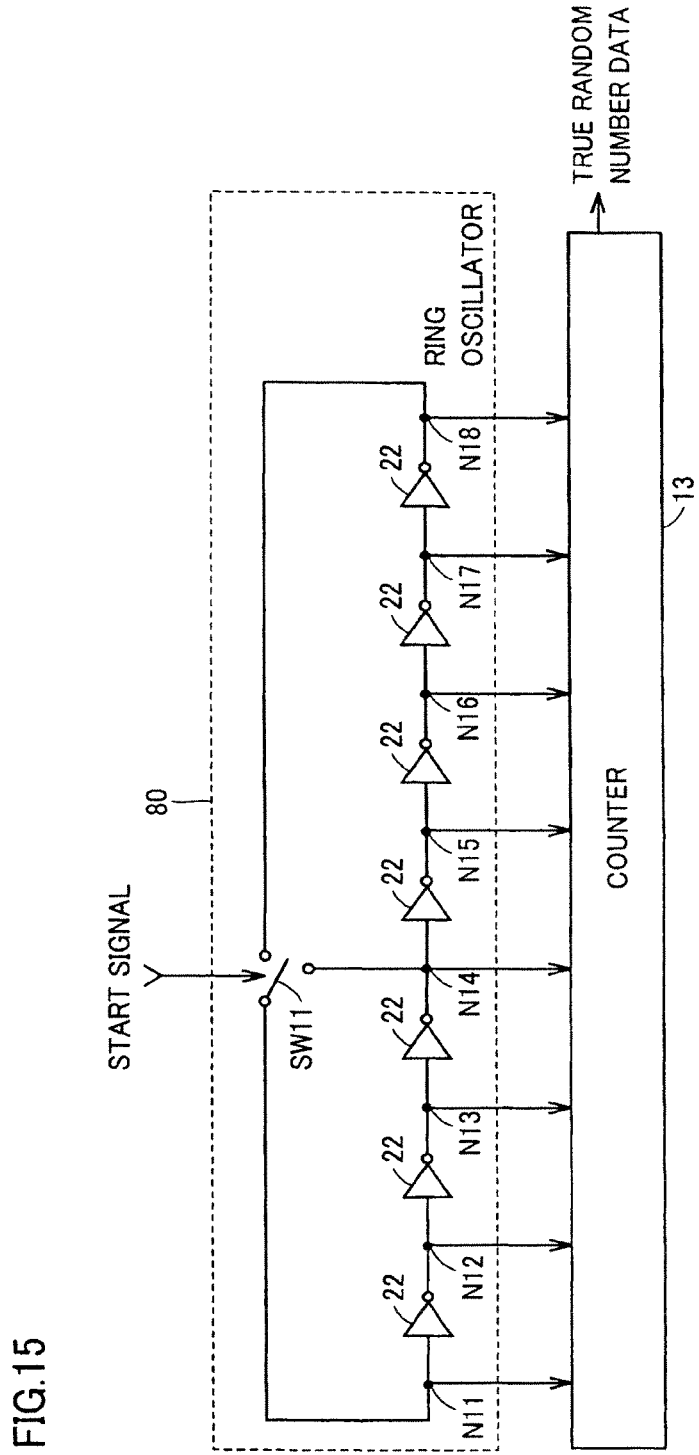
FIG. 15 is a circuit diagram showing a configuration of the ring oscillator of the present invention in a fourth embodiment.

With reference to FIG. 15, a fourth embodiment provides a ring oscillator 80 including a switch circuit SW11 and seven inverters 22.

Ring oscillator 80 has seven inverters 22 connected in series between output nodes N11 and N18. Switch circuit SW11 operates in response to the start signal of the high level to connect output nodes N11 and N14 and in response to the start signal of the low level to connect output nodes N11 and N18. More specifically, for the start signal of the high level the circuit switches to allow the loop to have three (an odd number of) inverters 22 therein and for the start signal of the low level the circuit switches to allow the loop to have seven (an odd number of) inverters 22 therein. Thus for the start signal of the high level the loop enters a short-loop oscillation state (high in oscillation frequency) and for the start signal of the low level the loop enters a long-loop oscillation state (low in oscillation frequency). Output nodes N11-N18 are connected to the counter 13 flip-flops, respectively, at their respective clock input terminals.

Figure 16:
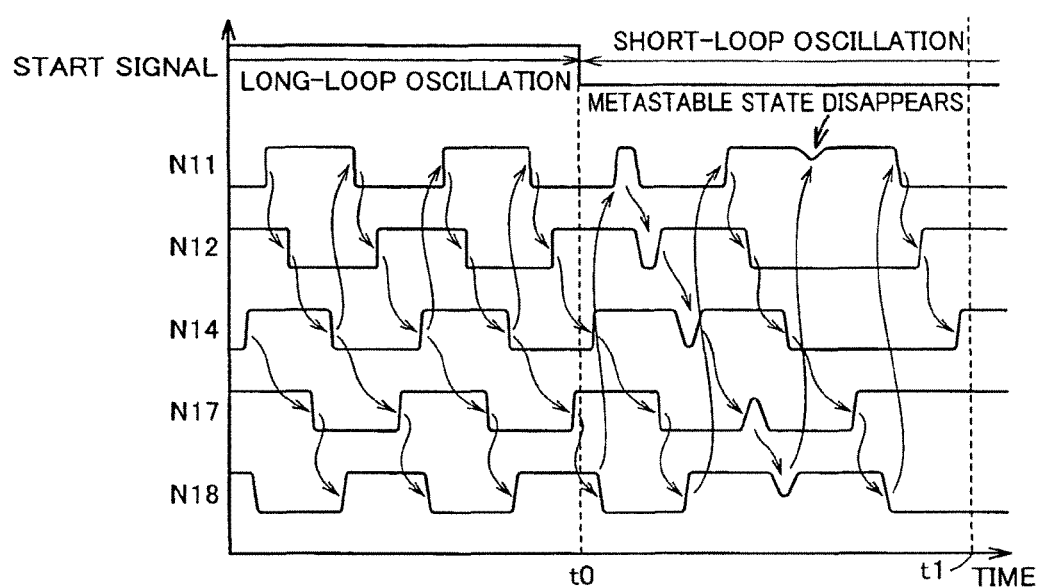
FIG. 16 is timing plots for illustrating the FIG. 15 ring oscillator in operation.

FIG. 16 is timing plots for illustrating ring oscillator 80 in operation. In the figure at time t0 the start signal is pulled low.

In response, output nodes N11-N18 sequentially enter metastable state. The metastable waveform becomes smaller with time and after it travels around the loop once it disappears at output node N1. As metastable state cannot be controlled in longevity, it disappears at any random node. Thus, after time t0 when a prescribed period of time elapses (or metastable state disappears), or at time t1, counter 13 outputs a signal serving as true random number data depending on the longevity of the metastable state.

Thus in the fourth embodiment ring oscillator 80 can have three (an odd number of) inverters 22 and seven (an odd number of) inverters 22 forming long and short loops, respectively, switched by switch circuit SW11 to eliminate the necessity of generating a start signal having a pulse of a width shorter than the ring oscillator 80 loop's delay time to introduce metastable state as it can be readily introduced simply by pulling the start signal low. A more simply configured random number generator can thus be implemented.

While in the above description ring oscillator 80 includes seven inverters 22, any ring oscillator 80 including any odd number of inverters 22 and allowing the short loop's oscillation frequency to be sufficiently higher than the long loop's oscillation frequency is similarly effective.

Furthermore, this ring oscillator can be implemented by using an NAND gate, similarly as has been described in connection with the FIG. 12 ring oscillator 70.

Fifth Embodiment

Figure 17:
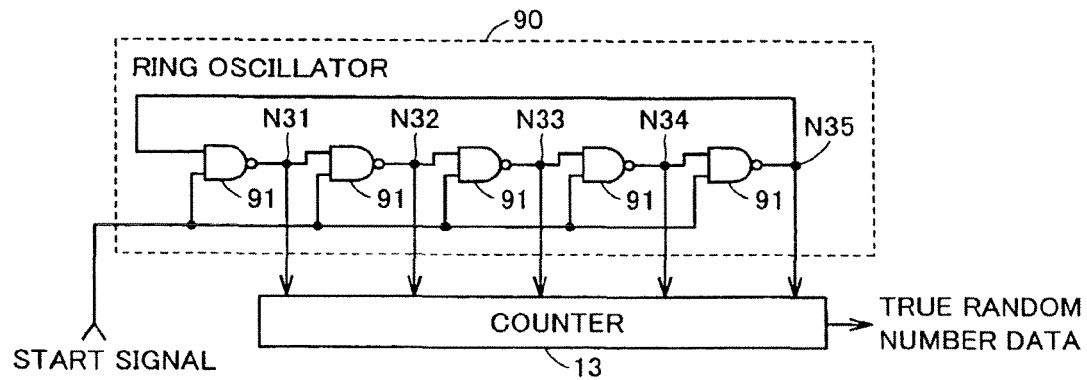
FIG. 17 is a circuit diagram showing a configuration of the ring oscillator of the present invention in a fifth embodiment.

With reference to FIG. 17, a fifth embodiment provides a ring oscillator 90 including five NAND gates 91.

Each NAND gate 91 has one input terminal receiving a signal output from NAND gate 91 of the preceding stage, and the other input terminal receiving the start signal, except that NAND gate 91 of the initial stage has one input terminal receiving a signal output from NAND gate 91 of the final stage. These five NAND gates 91 form a loop, which enters stable state for the start signal of the low level and oscillates for the start signal of the high level. Output nodes N31-N35 are connected to the counter 13 flip-flops, respectively, at their respective clock input terminals.

Figure 18:
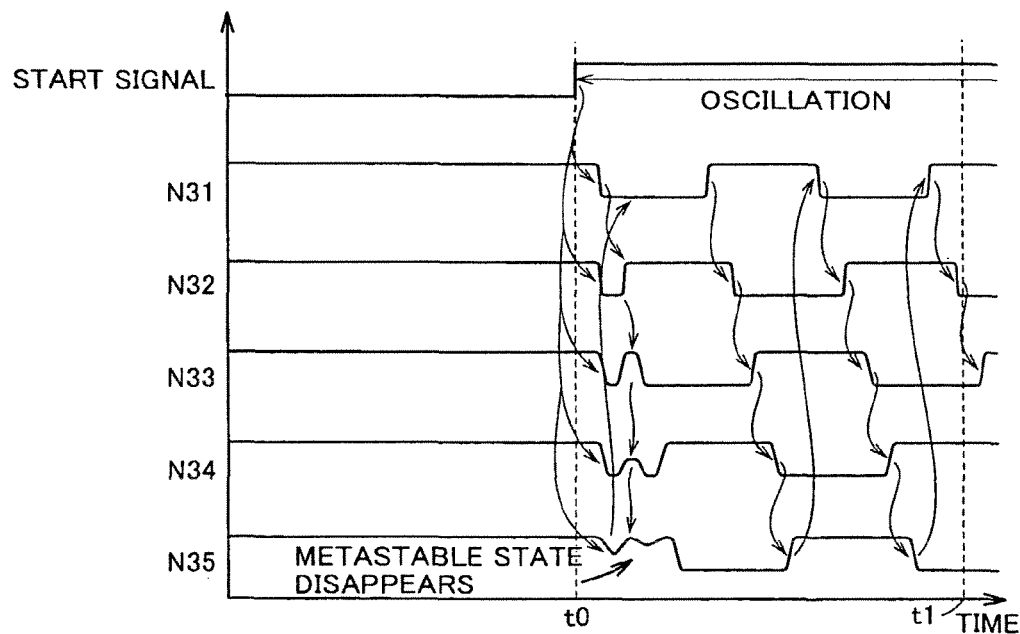
FIG. 18 is timing plots for illustrating the FIG. 17 ring oscillator in operation.

FIG. 18 is timing plots for illustrating ring oscillator 90 in operation. In the figure an initial state is a stable state with output nodes N31-N35 having a potential of the high level. At time t0 the start signal is pulled high and in response NAND gates 91 have their respective output nodes N31-N35 pulled low in potential and the loop subsequently transitions from the stable state to oscillation state, and output nodes N32-N35 sequentially enter metastable state. The metastable waveform becomes smaller with time and disappears at output node N35. As metastable state cannot be controlled in longevity, it disappears at any random node. Thus, after time t0 when a prescribed period of time elapses (or metastable state disappears), or at time t1, counter 13 outputs a signal serving as true random number data depending on the longevity of the metastable state.

Thus the fifth embodiment can eliminate the necessity of generating a start signal having a pulse of a width shorter than the ring oscillator 90 loop's delay time to introduce metastable state as it can be readily introduced simply by pulling the start signal high. A more simply configured random number generator can thus be implemented.

Note that while in the above description five NAND gates 91 are used, any odd number of NAND gates 91 is similarly effective.

Fifth Embodiment in Exemplary Variation

Figure 19:
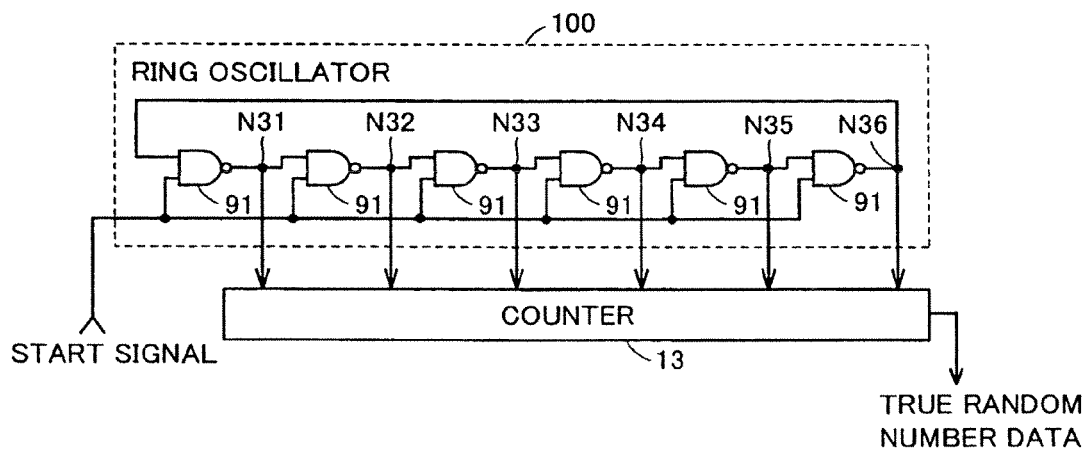
FIG. 19 is a circuit diagram showing a configuration of the ring oscillator of the fifth embodiment in an exemplary variation.

With reference to FIG. 19, the fifth embodiment in an exemplary variation provides a ring oscillator 100, which is distinguished from ring oscillator 90 of the fifth embodiment shown in FIG. 17 in that the former includes NAND gate 91 increased in number to six. These six NAND gates 91 form a loop, which enters stable state when the start signal has low and high levels. Output nodes N31-N36 are connected to the counter 13 flip-flops, respectively, at their respective clock input terminals.

An initial state is a stable state with output nodes N31-N36 having a potential of the high level. At time t0 the start signal is pulled high and in response NAND gates 91 have their respective output nodes N31-N36 pulled low in potential, and subsequently output nodes N31, N33, N35 transitions in potential to stable state of the low level and output nodes N32, N34, N36 to that of the high level, when output nodes N32-N36 sequentially enter metastable state. The metastable waveform becomes smaller with time and disappears. As metastable state cannot be controlled in longevity, it disappears at any random node. Thus, after time t0 when a prescribed period of time elapses (or metastable state disappears), or at time t1, counter 13 outputs a signal serving as true random number data depending on the longevity of the metastable state.

Thus the fifth embodiment in the exemplary variation as well as the forth embodiment can eliminate the necessity of generating a start signal having a pulse of a width shorter than the ring oscillator 100 loop's delay time to introduce metastable state as it can be readily introduced simply by pulling the start signal high. A more simply configured random number generator can thus be implemented.

Note that while in the above description six NAND gates 91 are used, any even number of NAND gates 91 is similarly effective.

Sixth Embodiment

Figure 20:
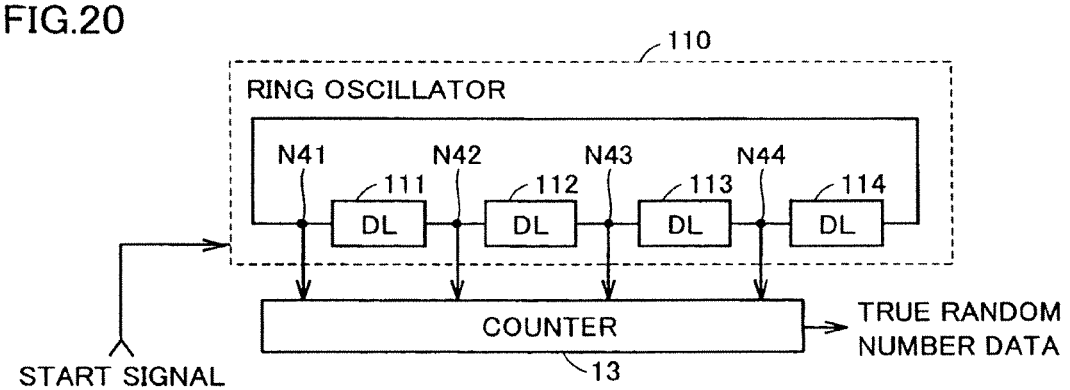
FIG. 20 is a block diagram showing a configuration of the ring oscillator of the present invention in a sixth embodiment.

With reference to FIG. 20, a sixth embodiment provides a ring oscillator 110 including delay circuits (DLs) 111-114.

DLs 111-114 are each configured of a single or plurality of elements to serve as a delay circuit (e.g., a delay circuit having an even number of inverters connected in series) outputting a positive logic signal. More specifically, when output node N41 has the high level output nodes N42-N44 also have the high level and when output node N41 has the low level output nodes N42-N44 also have the low level.

Furthermore, DLs 111-114 are delay circuits having identical delay characteristics. More specifically, if DLs 111-114 output signals pulled low the DLs' respective delay times are equal, and if DLs 111-114 output signals pulled high the DLs' respective delay times are equal. Output nodes N41-N44 are connected to the counter 13 flip-flops, respectively, at their respective clock input terminals.

Thus when start input generation portion 11 outputs a start signal and metastable state is responsively introduced there is provided a reduced possibility of the metastable state disappearing exclusively at a particular node.

Thus in the sixth embodiment metastable state can be provided with less biased longevity. True random number data of higher quality can be generated and a random number generator of higher performance can thus be implemented.

Sixth Embodiment in Exemplary Variation

In accordance with the present invention in the sixth embodiment as provided in an exemplary variation the FIG. 20 DLs 111-113 are each configured of a single or plurality of elements to serve as a delay circuit (e.g., a delay circuit having an odd number of inverters connected in series) to output a negative logic signal. More specifically, when output node N41 has the high level in potential output nodes N42, N44 attains the low level and output node N43 attained the high level in potential.

Furthermore, DLs 111 and 113 operate as delay circuits adapted to have identical delay characteristics and DLs 112 and 114 operate as delay circuits adapted to have identical delay characteristics, and the DLs 111 and 113 delay circuits' delay characteristics and the DLs 112 and 114 delay circuits' delay characteristics are opposite. More specifically, if a delay time introduced when DLs 111, 113 pull low a signal to be output therefrom is longer than that introduced when DLs 111, 113 pull the signal high, a delay time introduced when DLs 112, 114 pull low a signal to be output therefrom is shorter than that introduced when DLs 112, 114 pull the signal high. Output nodes N41-N44 are connected to the counter 13 flip-flops, respectively, at their respective clock input terminals.

Thus when start input generation portion 11 outputs a start signal and metastable state is responsively introduced there is provided a reduced possibility of the metastable state disappearing exclusively at a particular node.

Thus in the sixth embodiment in the exemplary variation as well as the sixth embodiment metastable state can be provided with less biased longevity. True random number data of higher quality can be generated and a random number generator of higher performance can thus be implemented.

Seventh Embodiment

Figure 21:
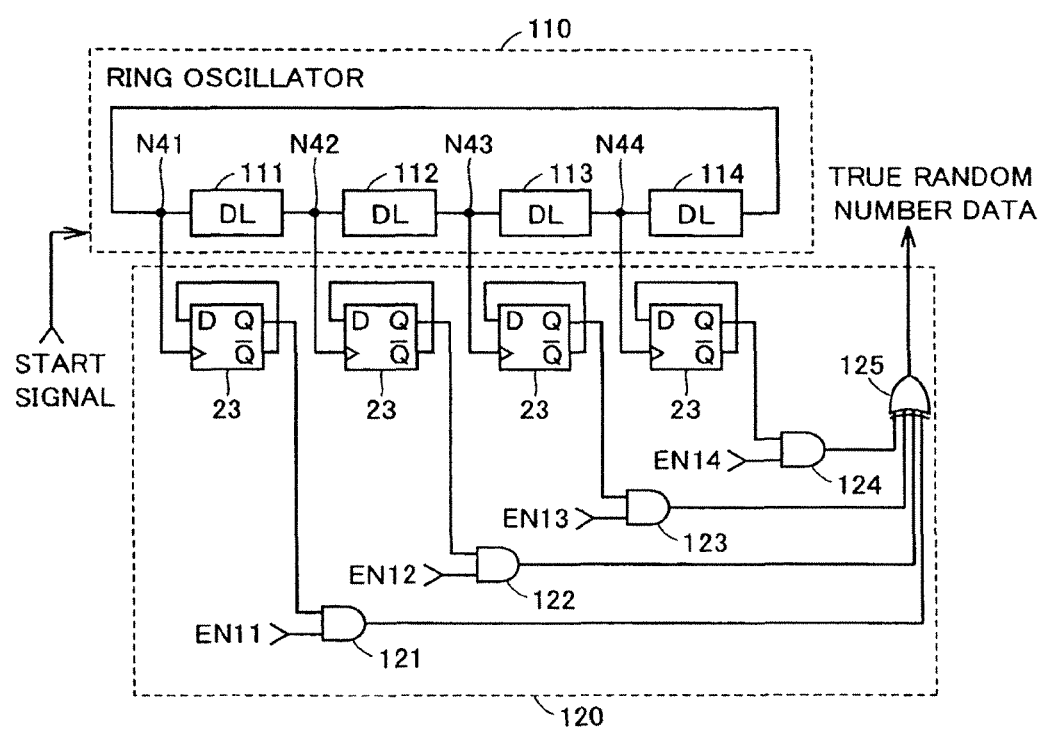
FIG. 21 is a block diagram showing a configuration of the ring oscillator and counter of the present invention in a seventh embodiment.

With reference to FIG. 21, a seventh embodiment provides a ring oscillator 110 including DLs 111-114, and a counter 120 including four flip-flops 23, AND gates 121-124, and an EX-OR gate 125.

DLs 111-114 are each a delay circuit configured of a single or plurality of elements. Output nodes N41-N44 are connected to respective flip-flops 23 at their respective clock input terminals. Each flip-flop 23 is a 1-bit counter having a negative logic output terminal and a data input terminal connected together. AND gates 121-124 have their respective input terminals receiving signals EN11-EN14, respectively, their respective other input terminals receiving positive logic signals output from the respective flip-flops 23, and their respective output terminals connected to EX-OR gate 125. EX-OR gate 125 outputs an exclusive OR signal of signals output from AND gates 121-124.

Thus in the seventh embodiment one of signals ENs 11-14 can be set high and the other three set low and a signal output from EX-OR gate 125 can be observed to test a circuit of DLs 111-114 and each flip-flop 23. For example, the loop is oscillated and signal EN11 is set high and signals ENs 12-14 set low, while a signal output from EX-OR gate 125 is observed. If EX-OR gate 125 outputs a normal signal a decision can be made that DLs 111-114 and flip-flop 23 connected to output node N41 are normal and if EX-OR gate 125 outputs an abnormal signal then a decision can be made that either DLs 111-114 or flip-flop 23 connected to output node N41 is defective. Similarly, signals ENs 12-14 can sequentially be set high, one at a time, while a signal output from EX-OR gate 125 can be observed to test a circuit of DLs 111-114 and each flip-flop 23.

Eighth Embodiment

Figure 22:
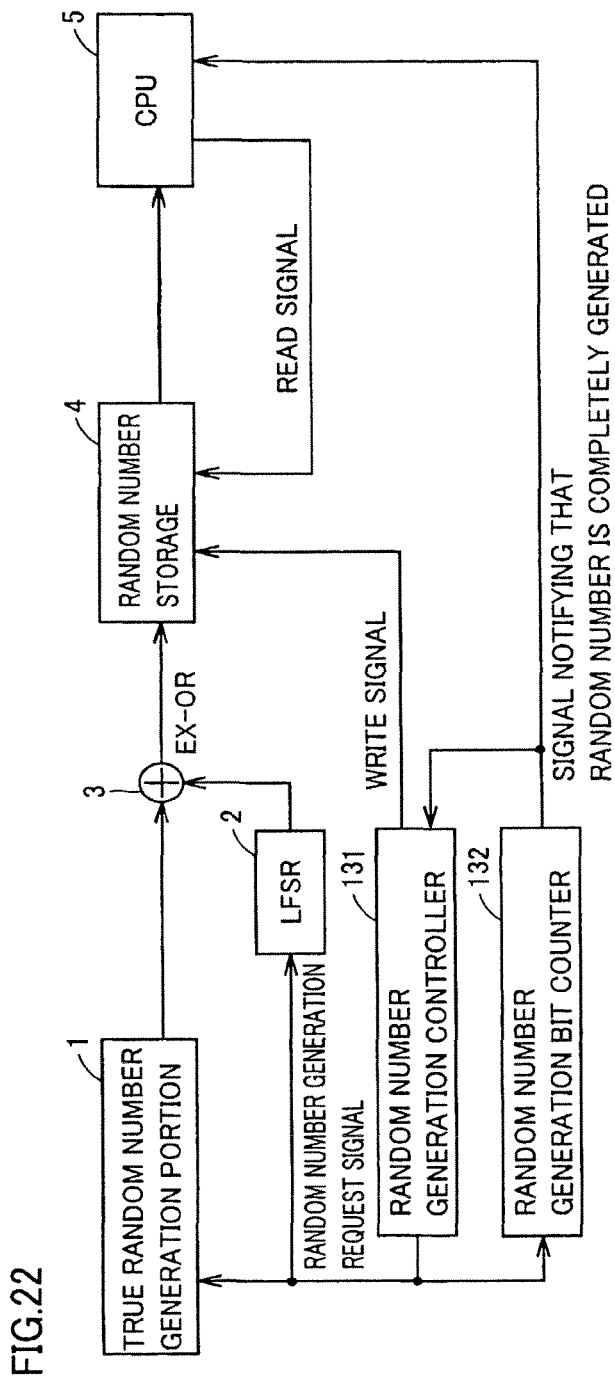
FIG. 22 is a block diagram showing a schematic configuration of the present random number generator in an eighth embodiment.

With reference to FIG. 22, an eighth embodiment provides a random number generator, which is distinguished from that of the first embodiment shown in FIG. 1 in that the former has a random number generation controller 131 and a random number generation bit counter 132 added thereto.

As shown in FIG. 22, random number generation controller 131 generates a random number generation request signal and provides it to true random number generation portion 1, LFSR 2 and counter 132, and also generates a write signal and provides it to random number storage 4. Counter 132 counts the number of pulses of a random number generation request signal output from random number generation controller 131 and when the counter counts the number of bits that random number storage 4 can store the counter generates a signal notifying that random number is completely generated and the counter outputs the signal to CPU 5 and random number generation controller 131.

Figure 23:
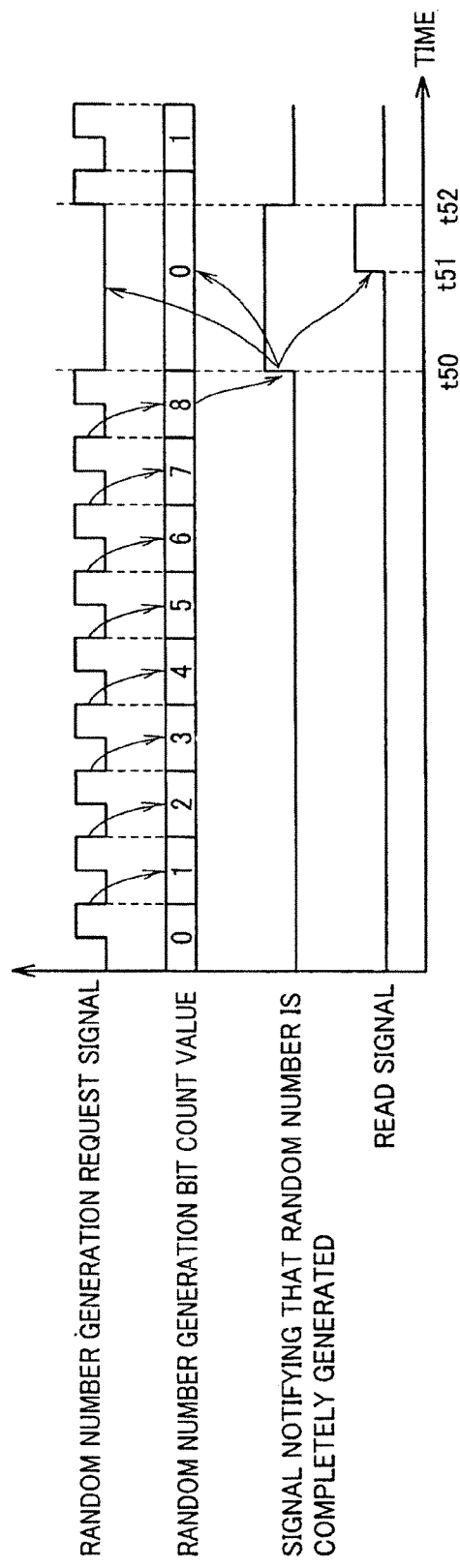
FIG. 23 is timing plots for illustrating the FIG. 22 random number generator in operation.

FIG. 23 is timing plots for illustrating the random number generator in operation. The FIG. 23 timing plots represent a waveform of each signal obtained when random number storage 4 stores 1-bit random number data thereto.

True random number generation portion 1 operates in response to a random number generation request signal output from random number generation controller 131 to generate true random number data. True random number generation portion 1 includes a ring oscillator having a loop adapted to oscillate for the random number generation request signal of the high level and entering stable state for the signal of the low level. LFSR 2 operates in response to the random number generation request signal output from random number generation controller 131 to generate a pseudo random number.

Counter 132 counts successively the number of pulses of the random number generation request signal output from random number generation controller 131. At a time t50 a random number generation bit count value of "8" is attained and in response a signal notifying that a random number is completely generated is pulled high and the random number generation bit counter value is reset to "0".

While counter 132 outputs the notification signal of the high level, controller 131 holds the random number generation request signal low. Thus while the notification signal is held high true random number generation portion 1 and LFSR 2 stop an operation generating a random number.

In response to the counter 132 notification signal being set high, CPU 5 pulls a read signal high at time t51 and reads an 8-bit random number value stored in random number storage 4.

At a time t52 counter 132 pulls the notification signal low and controller 131 pulls the request signal high and CPU 5 pulls the read signal low.

Thus in the eighth embodiment when CPU 5 reads a random number value from random number storage 4 a random number generation request signal is held low for a prescribed period of time and true random number generation portion 1 and LFSR 2 are stopped from operating to generate a random number. True number generation portion 1 and LFSR 2 can be operated less frequently. The random number generator can achieve reduced power consumption.

Eighth Embodiment in Exemplary Variation

Figure 24:
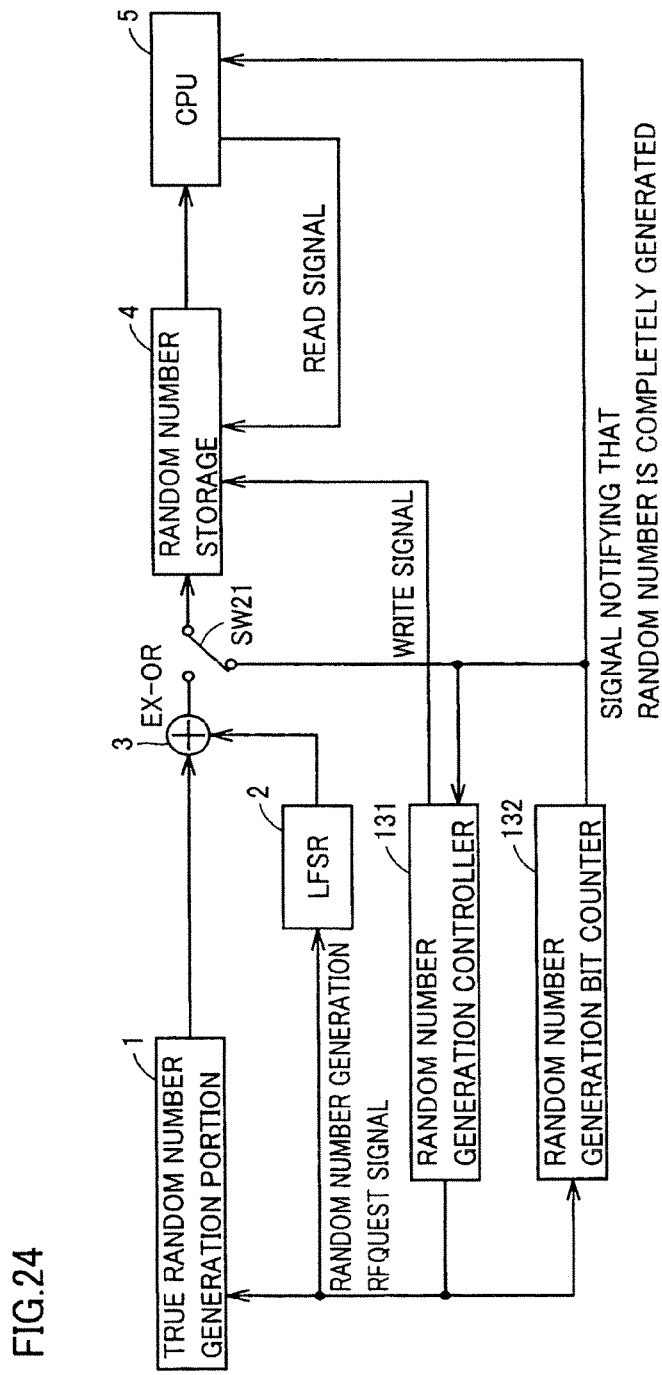
FIG. 24 is a block diagram showing a schematic configuration of the present random number generator of the eight embodiment in an exemplary variation.

With reference to FIG. 24, the eighth embodiment in an exemplary variation provides a random number generator, which is distinguished from that of the eighth embodiment shown in FIG. 22 in that the former has a switch circuit SW21 added thereto between EX-OR gate 3 and random number storage 4.

In FIG. 24 when switch circuit SW21 can be switched to allow random number storage 4 to receive from counter 132 a signal notifying that a random number is completely generated the control 131 and counter 132 operation can be tested.

Figure 25:
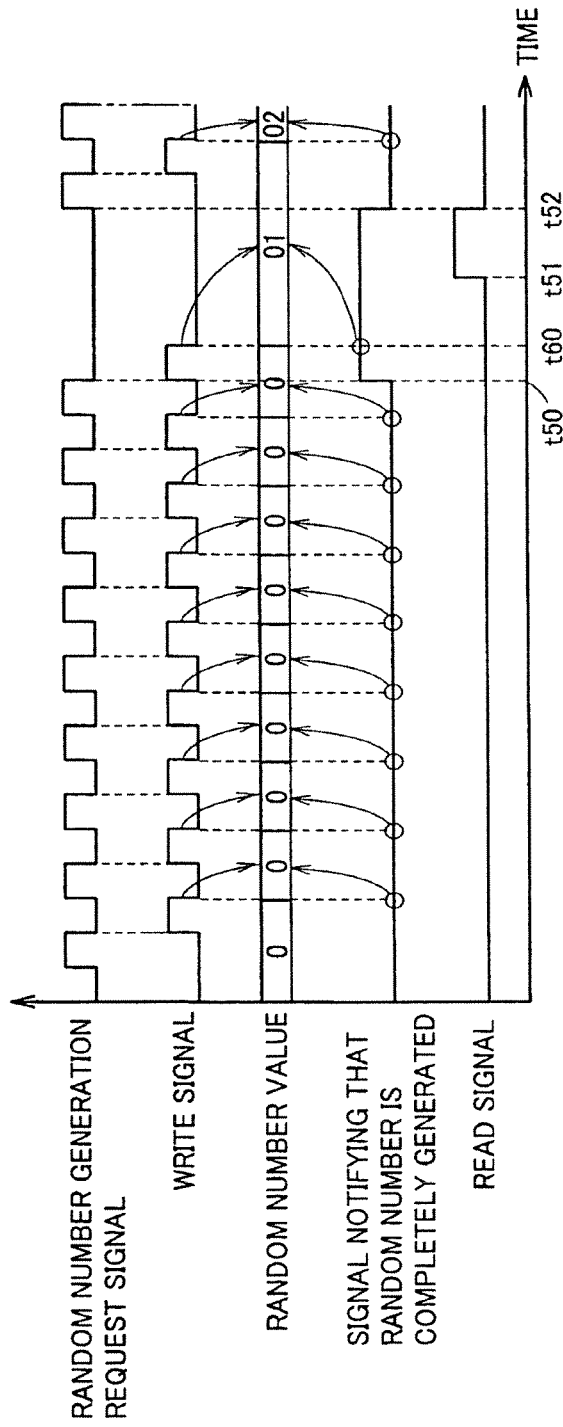
FIG. 25 is timing plots for illustrating the FIG. 24 random number generator in operation.

FIG. 25 is timing plot for illustrating the random number generator in operation. In the figure a random number value is represented hexadecimally and set to "0" for an initial state.

Controller 131 generates a random number generation request signal and a write signal equal in frequency and having a prescribed phase difference. Random number storage 4 stores in response to the write signal's falling edge the current value of a signal notifying that a random number is completely generated. Before time t50 the notification signal has the low level ("0") and random number storage 4 accordingly has a random number value of "0". At time t50 the notification signal is pulled high ("1") and accordingly at a time t60 the random number value attains "1" In response to the notification signal being set high ("1") CPU 5 pulls a read signal high at a time t51 to read the random number value of random number storage 4. If the read random number value is "1" a decision is made that controller 131 and counter 132 are operates normally. If the read random number value is other than "1" then either controller 131 or counter 132 is considered defective. At a time t52 counter 131 pulls the notification signal low and controller 131 pulls the request signal high, and CPU 5 pulls the read signal low.

Thus in the eighth embodiment as provided in the exemplary variation the random number generation controller 131 and random number generation bit counter 132 operation can be tested.

Ninth Embodiment

Figure 26:
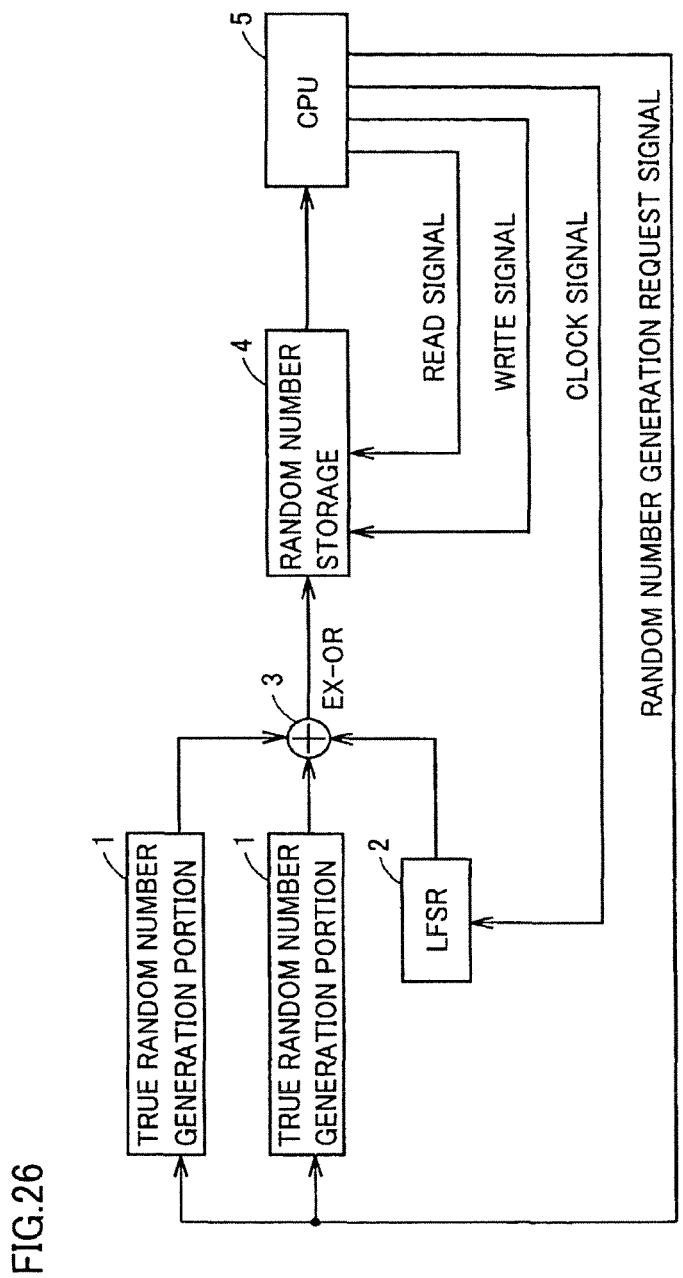
FIG. 26 is a block diagram showing a schematic configuration of the present random number generator in a ninth embodiment.

With reference to FIG. 26, a ninth embodiment provides a random number generator, which is distinguished from that of the first embodiment shown in FIG. 1 in that the former includes true random number generation portion 1 increased in number to two.

In FIG. 26 the two true random number generation portions 1 operate in response to a random number generation request signal output from CPU 5 to generate true random number data and output it to EX-OR gate 3. The two true number generation portions 1 are different in oscillation frequency. If one true random number generation portion 1 does not generate metastable state, the other can generate it.

Thus in the ninth embodiment a plurality of true random number generation portions 1 allows a random number to be generated with high quality. A random number generator of higher performance can thus be implemented.

While in the above description two random number generation portions 1 are employed, more than two true random number generation portions 1 different in oscillation frequency may be employed. That any one of true random number generation portions 1 generates metastable state suffices, and a similar effect can be obtained.

Tenth Embodiment

Figure 27:
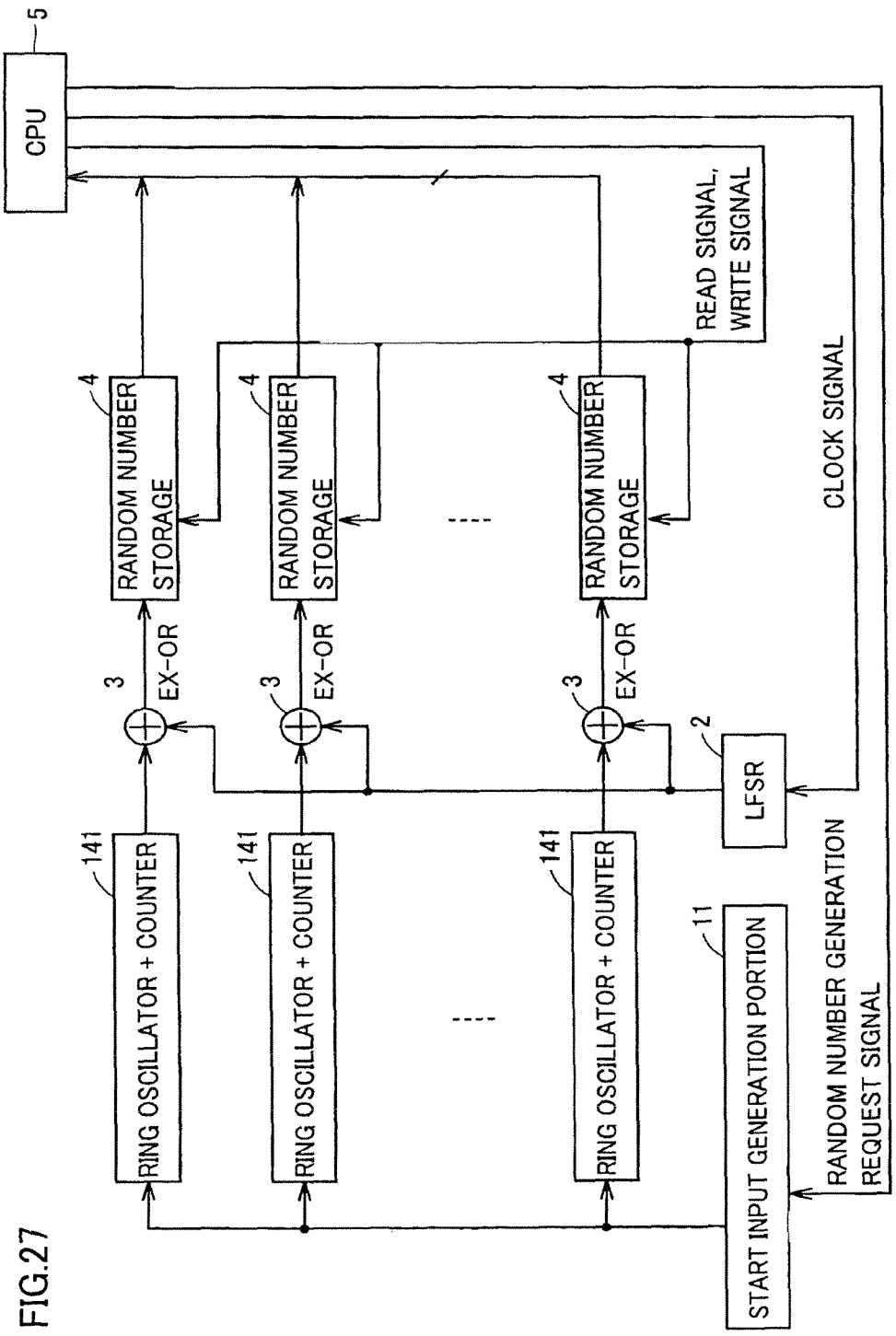
FIG. 27 is a block diagram showing a schematic configuration of the present random number generator in a tenth embodiment.

With reference to FIG. 27, a tenth embodiment provides a random number generator, which is distinguished from that of the first embodiment shown in FIG. 1 in that true random number generation portion 1 is replaced with start input generation portion 11 at a plurality of ring oscillators and counters 141 and that EX-OR gate 3 and random number storage 4 are increased in number to more than one.

In FIG. 27 start input generation portion 11 is identical to that shown in FIG. 2 and it operates in response to a random number generation request signal output from CPU 5 to generate a start signal. Each ring oscillator and counter 141 includes the FIG. 2 ring oscillator 12 and counter 13 and operates in response to the start signal output from start input generation portion 11 to generate true random number data and output it to a corresponding EX-OR gate 3. This allows a single start input generation portion 11 to generate more than one true random number data in parallel. LFSR 2 operates in accordance with a clock signal output from CPU 5 to generate pseudo random number data and output it to a plurality of EX-OR gates 3. Note that LFSR 2 is not required to receive the clock signal from CPU 5 and may instead receive a write signal from CPU 5. Each EX-OR gate 3 receives true random number data from a corresponding ring oscillator and counter 141 and pseudo random number data from LFSR 2 to take their exclusive OR data and output it to random number storage 4. Each random number storage 4 stores in response to a write signal output from CPU 5 the random number data received from a corresponding EX-OR gate 3 and in response to a read signal output from CPU 5 outputs a stored random number value.

Thus in the tenth embodiment a plurality of ring oscillators and counters 141, a plurality of EX-OR gates 3 and a plurality of random number storages 4 can be arranged in parallel to allow multibit random data to be simultaneously generated. A random number can more rapidly be generated. A random number generator of higher performance can thus be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor apparatus comprising:
   a central processing unit which provides a request signal;
   a random number storing circuit; and
   a random number generating circuit, which comprises a ring oscillator including a plurality of gate circuits, a signal generator receiving the request signal and providing a start pulse whose width is shorter than a total delay time of the plurality of gate circuits and a counter counting a number of output signals from the plurality of gate circuits,
   wherein
   the random number generating circuit generates a first random number by counting with the counter the number of output signals from the plurality of gate circuits during a predetermined period, which is determined by a time of a metastable being disappeared in the ring oscillator, after the ring oscillator receiving the start pulse, and
   the random number storing circuit stores the first random number generated by the counter in the random number generating circuit as a random number, and outputs the random number to the central processing unit in accordance with a read request from the central processing unit.

2. The semiconductor apparatus according to claim 1, further comprising:
   a pseudo random number generating circuit, wherein
   the pseudo random number generating circuit generates a second random number, and
   the random number stored in the random number storing circuit is operated by using the first random number and the second random number with an exclusive OR gate circuit.

3. The semiconductor apparatus according to claim 2, wherein
   a period of the request signal having a first level is variable, and the central processing unit determines the period.

* * * * *

UNITED STATES PATENT AND TRADEMARK OFFICE
CERTIFICATE OF CORRECTION

PATENT NO. : 9,052,975 B2
APPLICATION NO. : 13/565591
DATED : June 9, 2015
INVENTOR(S) : Kazuhiko Fukushima et al.

It is certified that error appears in the above-identified patent and that said Letters Patent is hereby corrected as shown below:

Title Page

Item (73) Assignee should read: Renesas Electronics Corporation    Kanagawa, Japan
                                Renesas LSI Design Corporation    Hyogo, Japan Signed and Sealed this
Twenty-fifth Day of August, 2015

Michelle K. Lee
*Director of the United States Patent and Trademark Office*